United States Patent
Abou-Khousa

(10) Patent No.: US 11,397,228 B2
(45) Date of Patent: Jul. 26, 2022

(54) HIGH-RESOLUTION UHF NEAR-FIELD IMAGING PROBE

(71) Applicant: Khalifa University of Science and Technology, Abu Dhabi (AE)

(72) Inventor: Mohamed Abou-Khousa, Abu Dhabi (AE)

(73) Assignee: Khalifa University of Science and Technology, Abu Dhabi (AE)

(*) Notice: Subject to any disclaimer, the term of this patent is extended or adjusted under 35 U.S.C. 154(b) by 0 days.

(21) Appl. No.: 16/727,050

(22) Filed: Dec. 26, 2019

(65) Prior Publication Data
US 2020/0209171 A1    Jul. 2, 2020

Related U.S. Application Data

(60) Provisional application No. 62/784,908, filed on Dec. 26, 2018.

(51) Int. Cl.
*G01R 33/00* (2006.01)
*G01R 33/34* (2006.01)
(Continued)

(52) U.S. Cl.
CPC ............ *G01R 33/34* (2013.01); *G01N 22/02* (2013.01); *G01R 33/00* (2013.01); *H04N 5/247* (2013.01)

(58) Field of Classification Search
CPC .............................. G01N 24/008; H01P 7/005
See application file for complete search history.

(56) References Cited

U.S. PATENT DOCUMENTS

| 6,411,105 | B1* | 6/2002 | Liu | G01N 17/006 324/639 |
| 2002/0106820 | A1* | 8/2002 | Nikawa | G01R 31/311 438/14 |

(Continued)

OTHER PUBLICATIONS

Hayat T, Rana AA. Dual-band miniaturized UHF-RFID tag for scaled-down networks using spiral resonators. In2016 International Conference on Computing, Electronic and Electrical Engineering (ICE Cube) Apr. 11, 2016 (pp. 1-5). IEEE. (Year: 2016).*

(Continued)

*Primary Examiner* — Clifford Hilaire
(74) *Attorney, Agent, or Firm* — Kilpatrick Townsend & Stockton LLP

(57) ABSTRACT

The present invention discloses imaging antenna and array by designing the system in the Ultra-high frequency (UHF) band 300 MHz-3 GHz with resolution comparable to high-frequency microwave imagers (i.e., super-resolution). To obtain high resolution at relatively low system cost and complexity, a novel modulated antenna array element design is disclosed. The antenna is basically small loop loaded with spiral resonator. The selection of the SR as a resonator provides for adequate miniaturization rate at the lower end of the microwave frequency range. A non-modulated version of this antenna has been conceived and yielded a resolution comparable to the 24 GHz antennas while operating at 426 MHz. The disclosed antenna element operating at 426 MHz produced images with very comparable attributes to the one obtained at 24 GHz. In fact, it has been established that proposed antenna element yield a resolution of around 5 mm (much less that the wavelength divided by 100), and hence it provides super-resolution as long as the diffraction limit is concerned. The present invention further discloses an imaging probe unit comprising a imaging sensor loaded with a PIN diode, an L-matching circuit and an LC resonant (Continued)

detuning circuit. The present invention further discloses a one-dimensional array, comprising a plurality of imaging probe units which are placed side by side in very close proximity of each other.

20 Claims, 39 Drawing Sheets

(51) Int. Cl.
    *G01N 22/02* (2006.01)
    *H04N 5/247* (2006.01)

(56) References Cited

U.S. PATENT DOCUMENTS

| | | | | |
|---|---|---|---|---|
| 2003/0028095 | A1* | 2/2003 | Tulley | G01R 33/3657 600/422 |
| 2013/0324057 | A1* | 12/2013 | Zhang | H04B 1/0458 455/77 |
| 2015/0355297 | A1* | 12/2015 | Menon | G01R 33/422 324/322 |
| 2019/0018090 | A1* | 1/2019 | Georget | G01R 33/365 |
| 2020/0041587 | A1* | 2/2020 | Findeklkee | G01R 33/3664 |

OTHER PUBLICATIONS

Ha-Van N, Seo C. A single-feeding port HF-UHF dual-band RFID tag antenna. Journal of Electromagnetic Engineering and Science. Oct. 31, 2017;17(4):233-7. (Year: 2017).*

Zhuravel AP, Bae S, Shevchenko SN, Omelyanchouk AN, Lukashenko AV, Ustinov AV, Anlage SM. Imaging the paramagnetic nonlinear Meissner effect in nodal gap superconductors. Physical Review B. Feb. 6, 2018;97(5):054504. (Year: 2018).*

Shafi KM, Abou-Khousa MA. Super-resolution microwave imaging using small loop loaded with spiral resonator. In2017 IEEE Sensors Oct. 2017(pp. 1-3). IEEE. (Year: 2017).*

Barnes BM, Sohn MY, Goasmat F, Zhou H, Vladár AE, Silver RM, Arceo A. Three-dimensional deep sub-wavelength defect detection using $\lambda$=193 nm optical microscopy. Optics express. Nov. 4, 2013;21(22):26219-26. (Year: 2013).*

Reykowski A. Overview of signal detection and the RF Chain. InISMRM Ann. Meeting [RF system Engineering Session] 2006. (Year: 2006).*

Maleeva N, Averkin A, Abramov NN, Fistul MV, Karpov A, Zhuravel AP, Ustinov AV. Electrodynamics of planar Archimedean spiral resonator. Journal of Applied Physics. Jul. 21, 2015;118(3):033902. (Year: 2015).*

* cited by examiner

HIGH-RESOLUTION UHF NEAR-FIELD IMAGING PROBE

FIELD OF THE INVENTION

The present invention relates to the field of imaging, more particularly to near-field microwave imaging.

BACKGROUND OF THE INVENTION

Background description includes information that may be useful in understanding the present invention. It is not an admission that any of the information provided herein is prior art or relevant to the presently claimed invention, or that any publication specifically or implicitly referenced is prior art.

Near-field microwave imaging techniques have proven significant utility in the wide range of industrial applications including mapping of corrosion under thin coating inspection of composite materials and surface crack detection among others. These imaging techniques have evolved over the past years as potential alternative for the existing imaging modalities. In active near-field microwave imaging, an imaging probe is used to irradiate the object of interest with microwaves, while the object is placed in close proximity of the probe. The presence of the object perturbs the electromagnetic field distribution in the vicinity of the probe, and therefore, the measured complex reflection coefficient, resonance frequency, and/or quality factor are changed. Detection and consequently imaging are accomplished by measuring one or more of these parameters and rendering their variations in a spatially indexed map.

Microwave near-field imaging techniques can be broadly classified into two categories, namely, resonant and non-resonant methods. A resonant near-field imaging technique utilizes a resonant probe, which operates over a narrow band around the resonance frequency. Often times, the underlying detection concept relies on the fact that the near-field interaction between the probe and the object of interest is manifested by a change in the resonance frequency or the quality factor of the probe. On the other hand, non-resonant techniques rely on non-resonant probes, which could operate wide frequency bands. With such probes, the detection concept is commonly based on measuring the variations in probe's reflection coefficient in response to the target.

Most of the nonresonant near-field microwave imaging techniques have been employed using conventional open-ended rectangular waveguides. The rectangular waveguide probes have been preferred for near-field imaging because of their simple structure, ease of fabrication, and low cost. The near-field imaging resolution of the rectangular waveguide probes is on the order of the broader dimension of the waveguide aperture. Consequently, the high frequency of operation is required with such probes in order to yield high resolution microwave images. Many methods were devised in the past to improve the open-ended waveguide near-field imaging resolution by either tapering the waveguide or loading it with dielectric material.

However, operation in relatively high microwave frequency bands (X-band and above) remains required to yield resolutions in the order few millimeters when open-ended waveguide probes are utilized. Operating in frequencies in these bands reduces the signal penetration into the test object, and this in turn limits the utility of the probe for imaging high loss samples. Furthermore, the implementation cost and complexity of the imaging system increases as the frequency increase.

While reducing the operating frequency grants deeper inspection, it impacts the imaging resolution. Near-field imaging based on resonant probes has been demonstrated in the past as mean to tackle this tradeoff. Such probes were realized either by loading waveguide aperture with structures exhibiting resonance property, e.g., split-ring resonators (SRRs) and folded metallic strips, or by using planar microwave resonators. The near-field imaging resolution offered by the planar microwave resonator depends on the resonator dimensions. These probes have been implemented using either microstrip lines or a coplanar waveguide, and they typically use a two-port system to image the test sample.

Real-time microwave imagers are required to acquire and render high resolution images at rate in excess of 20 frames per second. The active microwave techniques proposed so far for imaging are mainly focused on enhancing spatial resolution in lateral direction, reducing image data acquisition time, developing compact imaging antennas, and designing a low cost system. The aforementioned features of microwave imaging systems are accomplished through designing transmitting and receiving elements with high resolution and sensitivity, employing various post processing algorithms, utilizing multi-element imaging arrays, as well as developing miniaturized microwave circuits for high frequency signal transmission and reception by applying advanced compact semiconductor components.

Practical microwave real-time imaging systems implementation requires densely packed array of elements (few hundreds to thousands) to avoid the slow mechanical scanning. Array utility makes the design signal routing and switching components integral part of the imaging system. For many reasons, the array design becomes an inevitable hurdle for practical imager realization at high microwave frequencies. The desired mono-static based microwave imaging systems use the same array element for transmitting and receiving, and hence, they require complex circuitry for signal routing and detection. It is because the received signal needs to be isolated from the transmitted signal which demands deploying extra routing and switching circuit components for hundreds of array elements. The circuit components introduce additional losses at high frequency of operation which eventually impact the overall performance of the system (reduces the dynamic range considerably). Furthermore, these additional signal routing and switching components make the system heavier and larger which in turn hinder its portability. In the case of bi-static imaging systems, the signal routing becomes more feasible since separate array elements for transmission and reception of microwave signal are used. Although the signal is routed in different directions, bi-static imaging demands more system real-estate to accommodate additional transmit elements. Accommodating more transmit elements is challenging since the elements are required to be densely packed in order to enhance the spatial resolution.

Since the spatial resolution is an important parameter of any imaging methods, most of the microwave imaging techniques developed so far are implemented at higher microwave frequencies (>5 GHz) as reported. The microwave components at these frequencies are relatively lossy which renders ineffective large imaging array designs. On the other hand, the current imaging systems which have provisions to avoid signal routing components are highly dependent on slow post processing algorithms which makes real-time operation not possible in practical inspection environment. For practical real-time microwave imager designs, time-consuming post processing methods and lossy signal routing/switching components should be avoided all together. To obtain the best possible resolution and facilitate convenient one-sided inspection, the imaging system should operate in mono-static mode. Furthermore, to yield the desired portability for hand-held field deployment, compact array and element designs should be adopted. The survey of current system reveals that none of the previously developed systems offer these attributes.

SUMMARY OF THE INVENTION

In the present invention, a spiral resonator (SR) excited by an electrically small loop is employed for microwave near-field imaging. The SR is loaded onto the loop which is fed through a matching and tuning circuit. The proposed sensor utilizes one port measurement where the image can be rendered using magnitude and phase of the reflection coefficient. The selfresonance frequency of the proposed SR is measured using a small test loop. The resolution of the sensor is verified through line scans over two parallel conducting wires. Finally, the sensor is used for near-field imaging of samples with various defects.

In the present invention, a small loop loaded with spiral resonator (SR) has been introduced as single port probe for near-field imaging in the UHF band (300 MHz-3 GHz). An equivalent circuit model is proposed to explain the operation of the probe and its matching circuit. Furthermore, the resolution and sensitivity of the proposed probe are comprehensively investigated using an electromagnetic numerical simulation software. The simulation results are verified experimentally using a fabricated prototype of the proposed probe operating at 426 MHz. To highlight probe's practical utility in typical inspection scenarios, the probe is used to image three practical multilayer composite samples and corrosion sample. Finally, the images obtained using the proposed probe and a conventional K-band rectangular waveguide probe operating at 24 GHz are compared.

In the present invention, the numerical simulation results and equivalent circuit model of the proposed microwave probe along with the theoretical sensitivity and the spatial resolution analysis are discussed. The measurement results including characterization of the probe, practical verification of the probe imaging parameters such as resolution and sensitivity, and imaging results of various test samples are also disclosed.

In the present invention, to obtain high resolution at relatively low system cost and complexity, a novel modulated antenna array element design is disclosed. The antenna is basically small loop loaded with spiral resonator. The selection of the SR as a resonator provides for adequate miniaturization rate at the lower end of the microwave frequency range. The SR could provide higher miniaturization rate compared to other resonant structures. Also, the SR could be excited with a single port which reduces the complexity and cost of the system. To this end, the SR excitation is achieved using a small loop antenna placed around the SR. The loop antenna creates a magnetic field perpendicular to the loop plane which contains the SR. Consequently, the magnetic field produced by the loop antenna will induce a current in the SR conductor.

In the present invention, the flux linage is maximized between the loop antenna and the SR. A matching circuit is used to match the sensor to 50 Ohm. An LC resonant detuning circuit with a PIN diode is used to modulated the antenna. Modulating the antenna with such circuit will reduce the mutual coupling (cross-talk) between the array elements considerably. This is true because, once activated, the de-tuning circuit inserts an open (infinite) impedance in series with the loop. In effect, reducing the current in the loop to the minimum (the loop becomes minimum scattering antenna). Furthermore, it modulation allows tagging the signal from the antenna. The de-tuning circuit is conveniently supplied with control voltage and dc current through bias-tees on the main RF input line. The antenna is built on high frequency four-layer printed circuit board with the and loop and spiral will be laid on the bottom layer and all other elements on the top layer. Such design will render very miniaturized foot print as desired for compact imager array design.

In the present invention, a non-modulated version of this antenna has been conceived and yielded a resolution comparable to the 24 GHz antennas while operating at 426 MHz. The disclosed antenna element operating at 426 MHz produced images with very comparable attributes to the one obtained at 24 GHz. In fact, it has been established that proposed antenna element yield a resolution of around 5 mm (much less that the wavelength divided by 100), and hence it provides super-resolution as long as the diffraction limit is concerned.

Aperture probes such as rectangular and circular apertures have been extensively used for near-field microwave imaging. The imaging resolution offered by these probes is in the order of the aperture dimensions. For a given aperture to radiate efficiently, its largest dimension should be a good fraction of the operating wavelength ($\lambda$), e.g., $\lambda/2$. Consequently, it is necessary to work at high microwave frequencies to obtain spatial resolutions in the order of few millimeters when aperture probes are used. On the other hand, near-field imaging based on apertures loaded with resonators probes has shown to provide high resolution while operating at a relatively low microwave frequencies. Remarkably, planar open resonator probes such as split ring resonators and spiral-loaded loops have demonstrated resolutions in order of very small fractions of the operating wavelength. For instance, the spiral-loaded loop working ultra-high frequency band (UHF) range at 400 MHz provides a spatial resolution of around $\lambda/140$. This resolution is in fact comparable to the resolution typically obtained using rectangular aperture probes working over the k-band frequency range (18-26.5 GHz).

Planar open resonator probes can be realized using either microstrip lines or coplanar waveguides. They can be operated with two port or one-port system to image the object of interest. Hence, they constitute a high resolution, low complexity, and low-profile alternative to the conventional near-field aperture probes.

All the planar open resonator imaging probes reported in past were scanned probes whereby the image is formed through mechanical scanning of a single probe over a given imaging plane. Mechanical scanning is a time-consuming process, and therefore, acquiring the image could take an excessively long time especially if the scan area is large. In industrial applications, the time it takes to produce the image is a critical factor in the inspection process. Hence, speeding up the imaging process using the planner open resonators become critical for its adoption in further applications.

Using one- or two-dimensional arrays of planar open resonator probes constitutes one appealing solution to decrease the imaging time. With arrays, multiple image points are acquired rapidly without the need for mechanical scanning. However, a critical technical challenge, namely, the mutual coupling, has to be addressed before planar open resonator arrays could be constructed and used for rapid imaging In the present invention, an imaging probe unit is disclosed, which comprises an imaging sensor consisting of a small loop antenna and a spiral resonator (SR). The imaging sensor is loaded with a PIN diode. The imaging probe unit further comprises an L-matching circuit used to match the imaging sensor, and an LC resonant detuning circuit, which controls probe response together with the PIN diode.

In the present invention, a one-dimensional array with a plurality of imaging probe unit is disclosed. The imaging probe units are placed side by side in very close proximity of each other. For high-resolution imaging, the array should be compact where the element probes are placed in very close proximity of each other (interspacing $\ll \lambda$). Due to the close proximity, the open resonators within the array will be tightly coupled to each other. With such coupling, mode splitting will be severe and the array elements cannot be operated independently as desired in any imaging array. In the present invention, the control of the coupling between the array elements through active loading of each element is disclosed. By loading the elements with a detuning circuit, it be shown that each element could be activated and deactivated electronically such that independent measurement could be acquired at each element once an array is formed.

In an aspect of the present invention is disclosed a high-resolution Ultra High Frequency (UHF) near-field imaging sensor comprising an electrical loop antenna and a spiral resonator (SR).

In an aspect of the present invention, the imaging sensor acts as a single port probe for near-field imaging in the UHF band. The UHF band is in the range of 300 MHz to 3 GHz.

In another aspect of the present invention, the spiral resonator (SR) is a square shaped SR.

In an aspect of the present invention, the SR provides for an adequate miniaturization rate at a lower end of a microwave frequency range.

In an aspect of the present invention, the SR is excited with a single port.

In another aspect of the present invention the electrical loop antenna is positioned around the SR for excitation of the SR.

In an aspect of the present invention, the electrical loop antenna has a plane which contains the SR, and wherein the electrical loop antenna creates a magnetic field perpendicular to the electrical loop plane.

In an aspect of the present invention, the SR has a conductor and wherein the electrical loop antenna creates a magnetic field which induces a current in the SR conductor.

In an aspect of the present invention, the SR has a side length in the range of 5 millimeters-10 millimeters.

In an aspect of the present invention, the side length of the SR is 7.2 millimeters.

In an aspect of the present invention, the loop and SR are made of copper strips laid on a thick Rogers 4350 substrate.

In an aspect of the present invention, the copper strips have a dimension in the range of 0.10-0.15 millimeters.

In a preferred aspect of the present invention the copper strips dimension is 0.127 millimeters.

In an aspect of the present invention, the imaging sensor has a resolution at 433 MHz comparable to a resolution of a rectangular waveguide aperture probe operating at 24 GHz in a K-band frequency range.

In an aspect of the present invention, the imaging sensor detects defects in multilayer dielectric samples and corrosion samples.

In an aspect of the present invention, the imaging sensor relies on one-port measurement the images are formed based on reflection coefficient measured at an input of the electrical loop.

In an aspect of the present invention, the imaging sensor has a resolution of around 5 millimeters at a frequency of 426 MHz.

In an aspect of the present invention, the imaging sensor has an operating wavelength and detects various surface anomalies and subsurface flaws with dimensions much smaller than the operating wavelength.

In an aspect of the present invention, the imaging sensor detects defects in composite structures.

In an aspect of the present invention is disclosed an imaging probe unit, comprising an imaging sensor as described above, wherein the imaging sensor is loaded with a PIN diode, an L-matching circuit used to match the imaging sensor, and an LC resonant detuning circuit, which controls probe response together with the PIN diode.

In an aspect of the present invention is disclosed a one-dimensional array, comprising a plurality of imaging probe units, wherein the imaging probe units are placed side by side in very close proximity of each other.

In an aspect of the present invention the imaging probe units are placed side by side with an interspacing distance of 9.14 mm.

In an aspect of the present invention, the array comprises eight identical imaging probe units arranged on an x-axis with uniform interspacing of 9.14 mm, wherein a total array length is around 73 mm.

In an aspect of the present invention, each LC resonant detuning circuit in the array can be controlled independently.

In an aspect of the present invention, an imaging system comprises a one-dimensional array, a vector network analyzer (VNA), a switch, which is connected to the one-dimensional array and the VNA, and a control unit which is configured to control the switch and the one-dimensional array.

BRIEF DESCRIPTION OF THE DRAWINGS

The subject matter that is regarded as the invention is particularly pointed out and distinctly claimed in the claims at the conclusion of the specification. The following drawings form part of the present specification and are included to further demonstrate certain aspects of the present invention, the inventions of which can be better understood by reference to one or more of these drawings in combination with the detailed description of specific embodiments presented herein. The foregoing and other aspects, features, and advantages of the invention are apparent from the following detailed description taken in conjunction with the accompanying drawings in which:

DETAILED DESCRIPTION OF THE INVENTION

Various small resonators can be used to construct near-field microwave imaging sensors. Circular/square SRRs, CSRRs, circular/square SR and Fractal Hilbert curves are some of the prominent examples of such small resonators. Selecting a certain resonator depends on the desired quality factor, miniaturization requirements, manufacturability, and feeding constrains. For near-field imaging, the sensor is ought to have small footprint and offer high sensitivity. Consequently, the spiral resonator types which offer significant miniaturization rate (resonator dimension of the order of 0.01, is highly feasible) and high Q-factor are suitable candidate for near-field imaging. Furthermore, the SR could be efficiently excited using a simple loop yielding a one-port sensor.

Figure 1A:
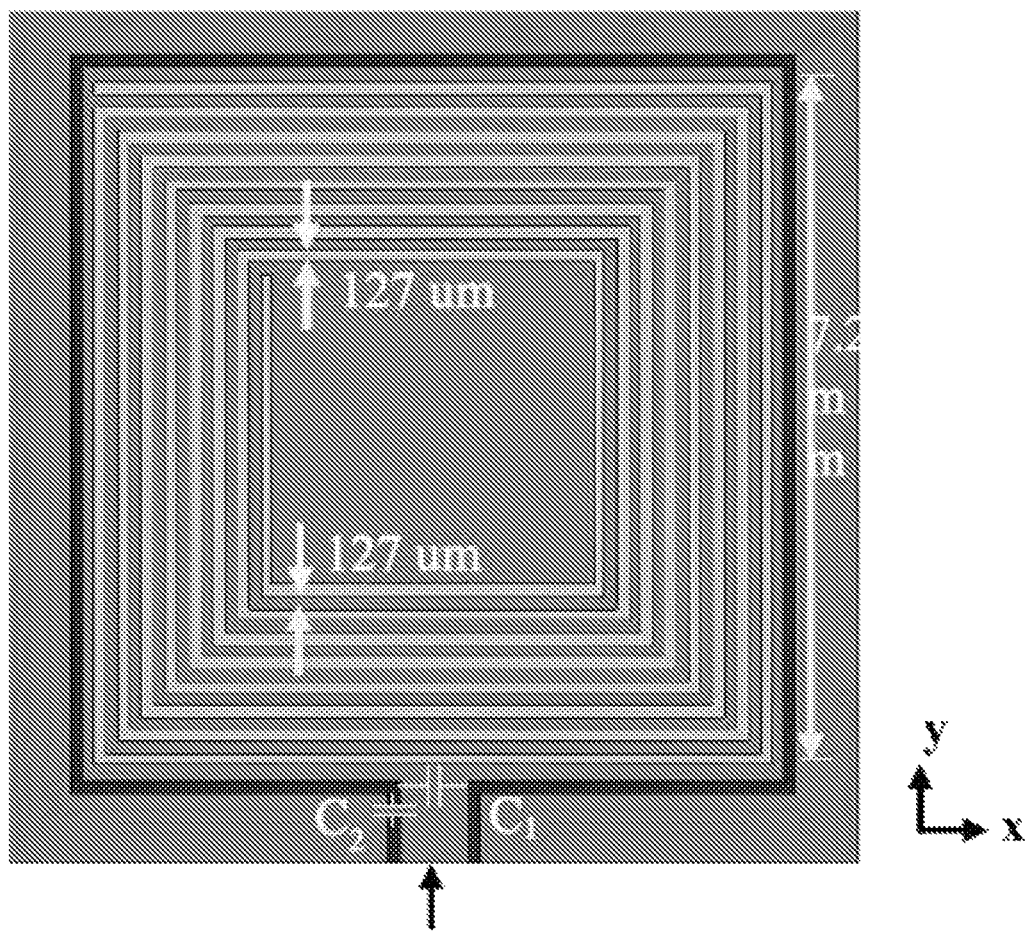
FIG. 1(a) illustrates the 3-D simulation model of the proposed UHF probe.

The proposed microwave imaging sensor utilizes an 8-turn square shaped resonator similar to the unit cell used in and shown in FIG. 1(a). The SR 102 was made of copper stripes laid on RO 4350 1.5 mm-thick dielectric substrate 101 with relative permittivity=3.48 and loss tangent=0.0037. The overall area (footprint) of the SR 102 is 7.2 mm×7.2 mm as shown in FIG. 1(a).

Figure 1B:
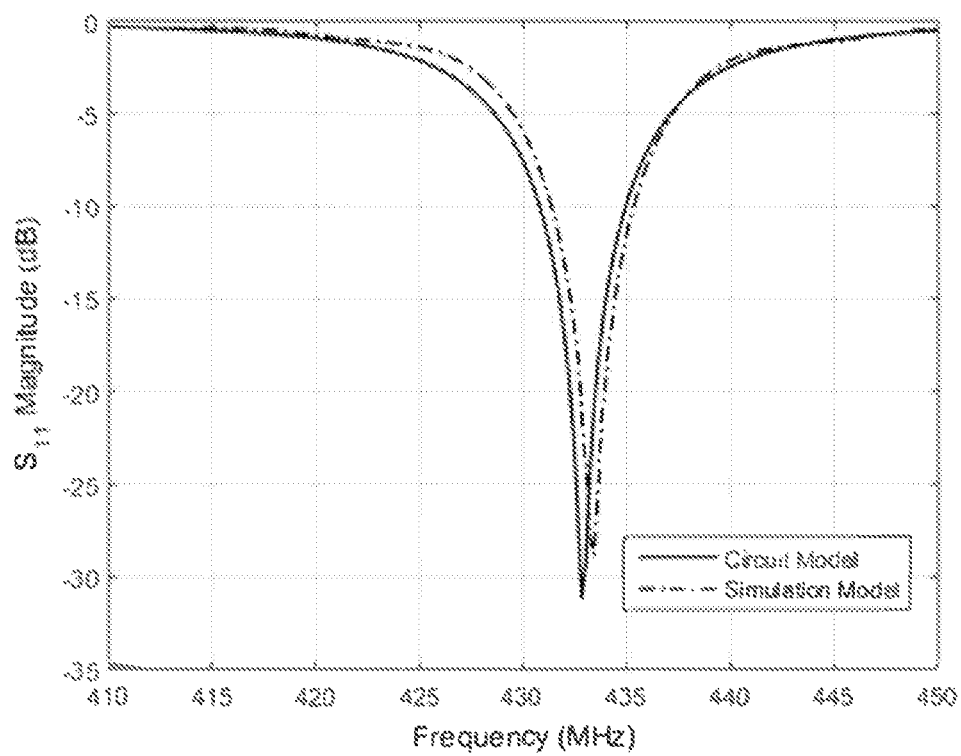
FIG. 1(b) illustrates the simulated frequency response.

The self-resonance frequency of SR 102 was measured using a test loop 103 loosely coupled to the SR 102. FIG. 1(b) shows the magnitude of the reflection coefficient, $S_{11}$, as a function of frequency measured for test loop when it was placed over the SR 102 (i.e., the test loop's magnetic field was orthogonal to the SR plane). The self-resonance frequency of the SR 102 was measured to be around 401.2

MHz as manifested by the dip in |S₁₁| measurement (the energy is maximally coupled from the test loop 103 to the SR 102 at the resonance frequency).

Figure 3:
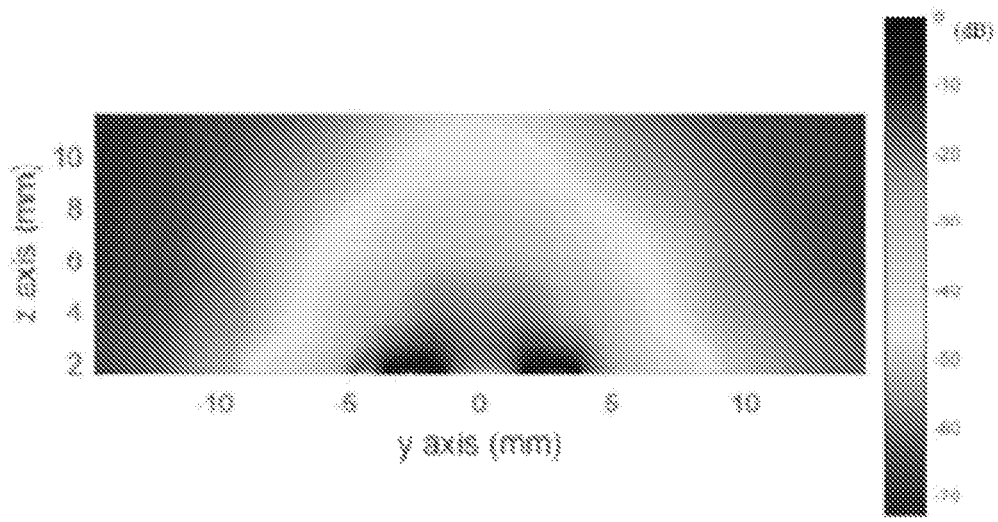
FIG. 3 illustrates the simulated electric field distribution in the near field of the probe in yz plane.

To excite the SR 102 and receive the signal from it, a small square loop of side length ~1 cm was used. The SR 102 was placed at the center of the feeding loop (effectively loading it). Finally, L-matching network of two capacitors was implemented at the input of the loop 104 to match it to 50-Ohm feeding coaxial cable and tune its resonance frequency. The imaging sensor consisting of the SR, small loop, matching circuit, and 50-Ohm coaxial cable. The reflection coefficient measured at the input of the sensor as a function of frequency. Low return loss (<20 dB) was achieved for the sensor at 246 MHz using designed matching circuit. The important performance parameters of any imaging sensor include its resolution and dynamic range. Because these parameters determine the performance of the sensor to faithfully render the spatial extent of any possible defects as well as to quantify severity of such defects in object being imaged. To highlight the dynamic range of the sensor in response to typical test target, a line scan was performed over a single conducting wire with various standoff distances (SOD, distance between the imaging sensor and the surface of the imaged object). The line scan was performed using a positioning table controlled through a computer program. FIG. 3 shows the variation in the magnitude and phase of the reflection coefficient as the sensor traverses a distance of 20 mm over a single conducting wire of 0.6 mm diameter at standoff distances 1 mm, 1.5 mm and 2 mm. It can be inferred from FIG. 3 that the standoff distance of 1 mm produces higher dynamic range corresponding to a line target for the magnitude of the reflection coefficient (almost 10 dB). However, the variation in phase is almost same for all values of SODs. Hence, the standoff distance was fixed at 1 mm for further sensor characterization.

Figure 4:
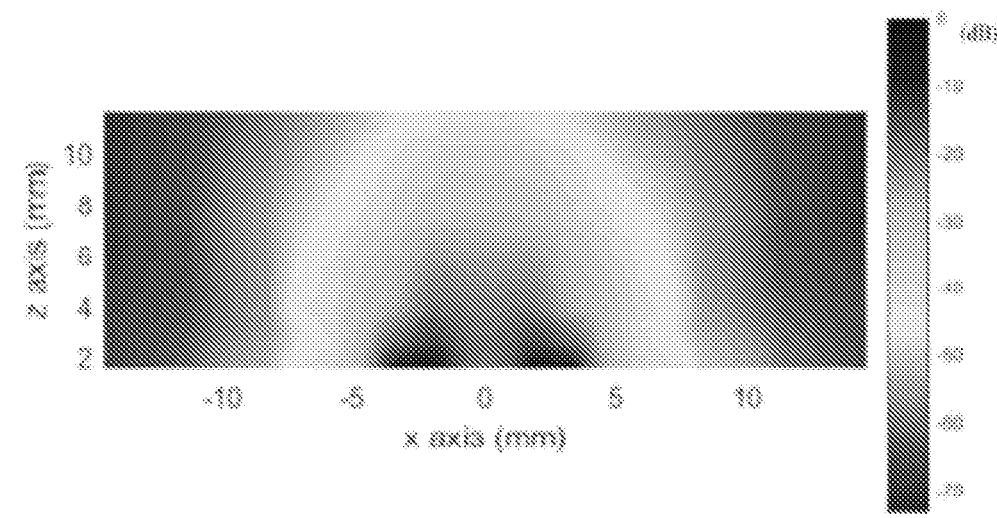
FIG. 4 illustrates the simulated electric field distribution in the near field of the probe in xz plane.

In order to verify the potential resolution offered by the proposed sensor, two conducting wire targets positioned parallel to each other at a specific distance, d, between their centers were scanned. The variation in the magnitude and phase of the reflection coefficient along the distance traversed by the sensor over the conducting wires are shown in FIG. 4. From FIG. 4, it can be observed that the two wire targets were clearly distinguished at a center to center interspacing, d=7.5 mm, while the sensor fails to differentiate between the targets at d=4.5 mm. At d=5, the sensor was able detect the two wire targets distinctly, which confirms the resolution of the sensor as 5 mm. The obtained resolution using the proposed sensor operating at 426 MHz is almost equal to the resolution of the hollow K-band rectangular waveguide aperture sensor operating at 24 GHz.

The utility of the proposed sensor for near-field imaging and its capability to detect small defects were validated by imaging practical samples. To this end, an acrylic sample with various predefined defects such as flat-bottom holes and notches as shown in FIG. 5(a) was imaged using the proposed sensor. The relevant defect dimensions in millimeters are annotated in FIG. 5(a) with the depth information provided between curly brackets, e.g., {2}. The notches are 12 mm long with various depths and widths. The diameters of the holes ranges between 1 mm and 4 mm with depth ranging from 1 to 2.5 mm. The letters "P" and "I" are engraved with of 2 mm depth. The proposed sensor was used to perform 2D raster scan of the sample while the reflection coefficient was measured using a vector network analyzer at each scan position. The standoff distance of the sensor from the sample was kept at 1 mm. The sample was scanned over an area of 115 mm by 45 mm with a step size of 1 mm. The image of the sample obtained using the magnitude of reflection coefficient is shown in FIG. 5(b). The proposed sensor produced clear indications of the defects with intensities indicative of the relative size/depth of the defect. However, the image obtained using the proposed sensor does not show distinct indications of two 1-mm holes separated by 3 mm. This is rather expected as the resolution of the sensor is 5 mm as discussed before.

Figure 6A:
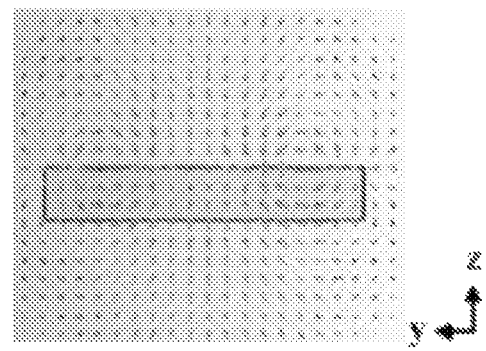
FIG. 6(a) illustrates the simulated electric field vectors in the yz plane (x=0 plane).
Figure 6B:
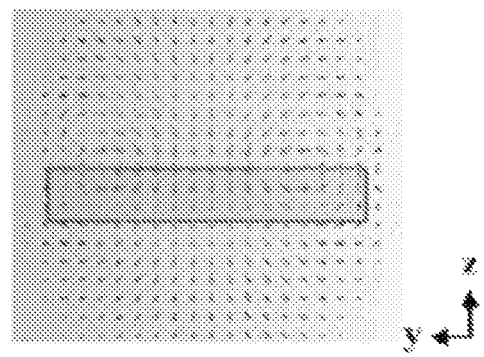
FIG. 6(b) illustrates the simulated magnetic field vectors in the yz plane (x=0 plane).

The near-field imaging capability of the sensor is further examined on a corrosion sample. A carbon steel substrate with a localized corrosion under a thin layer of paint was imaged using the sensor. A photograph of the sample after applying the paint is shown in FIG. 6(a). A 2D raster scan is performed over an area of 50 mm by 70 mm with SOD 1 mm and step size 1 mm. FIG. 6(b) shows the image obtained using the magnitude of the reflection coefficient. The corroded region is evident in the acquired image which clearly demonstrates the potential of the sensor for subsurface imaging.

A novel microwave resonant sensor for near-field imaging was developed and its performance was verified through imaging an acrylic sample with predefined defects as well as corrosion-under-paint sample. The proposed sensor is based on spiral resonator excited by the magnetic field produced by a simple loop. The sensor relies on one-port measurement whereby the images are formed based on the reflection coefficient measured at the input of the loop. The resolution of the sensor was found to be 5 mm at frequency of 426 MHz. The sensor showed great efficacy in detecting various surface anomalies and subsurface flaws with dimensions much smaller than the operating wavelength. The potential utility of the sensor for the detection of defects in composite structures will be investigated in the future.

There are different resonator designs proposed in the literature for various applications such as near-field sensing, material characterization, and filter design. Examples of these resonators include (SRRs), complementary SRR (CSRR), SR, and electric-LC resonator. In general, these resonator designs promise miniaturization of the microwave probe since the dimensions of the resonators are very small compared to the wavelength at the operating frequency.

Herein, a square shaped SR is considered for developing the near-field imaging probe in the ultra-high-frequency band. The selection of the SR as a resonator provides for adequate miniaturization rate at the lower end of the microwave frequency range. The SR could provide higher miniaturization rate compared to other resonant structures. For instance, with the same number of turns and side length, the SR would resonate at lower frequency compared to the SRR. Also, the SR could be excited with a single port, which reduces the complexity and cost of the system. To this end, the SR excitation is achieved using a small loop antenna placed around the SR. The loop antenna creates a magnetic field perpendicular to the loop plane, which contains the SR. Consequently, the magnetic field produced by the loop antenna will induce a current in the SR conductor. In effect, the flux linage is maximized between the loop antenna and the SR.

The model of the proposed UHF probe is provided in FIG. 1(a). The probe consists of an 8-turn square SR 102 with side length of 7.2 mm. A small loop 103 is designed around the SR 102 to excite it. The loop 103 and SR 102 are made of 0.127-mm copper strips laid on 1.5-mm-thick Rogers 4350 substrate. Unlike most of the proposed planner resonators used for near-field imaging in the past, only one port is used to feed the microwave signal into the loop and receive the reflected signal. Measurement of the reflection coefficient, resonance frequency, and/or quality factor of the probe can be used to produce subsurface images of samples under test (SUT). An L matching circuit consisting of two capacitors (C1 and C2) is used to match the probe to the feeding 50-Ω line.

The proposed probe was simulated using CST Microwave Studio. The values of both the capacitors in the matching circuit were optimized numerically. FIG. 1(b) shows the magnitude of the reflection coefficient (S11) as a function of frequency when C1 and C2 were both set to 30 pF. It is apparent that the probe is matched at a frequency of 433 MHz with return loss of 28.4 dB, as shown in FIG. 1(b).

Figure 2:
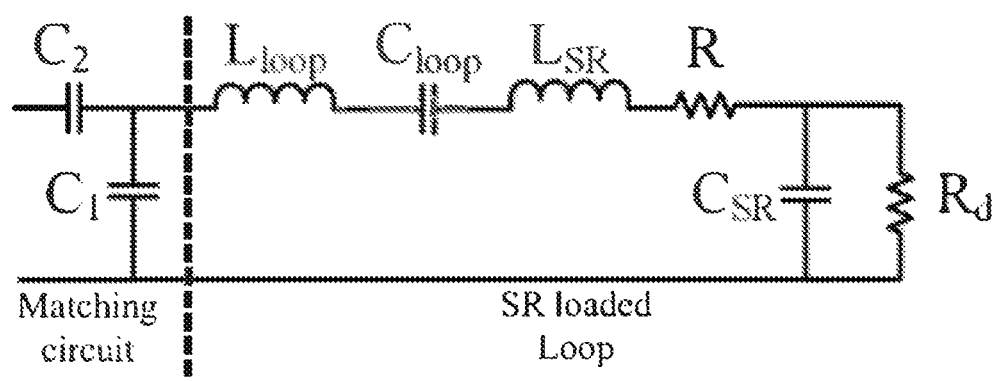
FIG. 2 illustrates the equivalent circuit model.

The design of the proposed probe and its matching circuit can be aided using the equivalent circuit model shown in FIG. 2. The lumped element, $L_{loop}$ 205 represents the self inductance of the loop 103 used to excite the SR 102. Here, it is assumed that the magnetic field from the loop 103 is completely coupled to the SR 102 as the loop 103 surrounds the SR 102 along its edges. Since the SR 102 is located very close to the loop 103, the capacitance $C_{loop}$ 206 is considered to incorporate the stray capacitance between the loop 103 and the SR 102. The element, $L_{SR}$ 207 represents the inductance of the SR 103. The dielectric loss and stray capacitance between the SR loop turns are modelled by the lumped elements $R_d$ 210 and $C_{SR}$ 209, respectively. The values of the SR 102 lumped element model parameters are calculated using expressions provided in. The value of the capacitance, $C_{loop}$ 206 is calculated using the mathematical relation for the resonance frequency of the equivalent circuit. The initial value of $L_{loop}$ 205 is obtained from inductance approximation for square loop under quasi-static assumption. Reference number 201 represents matching circuit. Reference number 202 represents SR loaded Loop. Reference number 203 represents $C_1$. Reference number 204 represents $C_2$.

The resistance (R) represents the ohmic loss in the loop 103 and SR conductors, and its value is optimized to match the response of the circuit model with the simulation model. FIG. 1(b) shows the comparison of the reflection coefficient results obtained using the simulation and circuit model. The close agreement between the simulation model and circuit model results validates the developed equivalent circuit model. The difference between the 3-D simulation and the equivalent circuit results is attributed in part to the fact the circuit model does not entirely capture the wave behavior (i.e., the radiation). Furthermore, the lumped element model values of the SR are based calculated from models which were derived with simplifying assumptions. Table I reports the values of the lumped elements after optimizing the response of the circuit.

TABLE I

Values of lumped elements

| $L_{loop}$ | $C_{loop}$ | $L_{SR}$ | $C_{SR}$ | R | $R_d$ |
|---|---|---|---|---|---|
| 35.8 nH | 2.4 pF | 24.6 nH | 38.79 pF | 2 Ω | 0.15 Ω |

Figure 5:
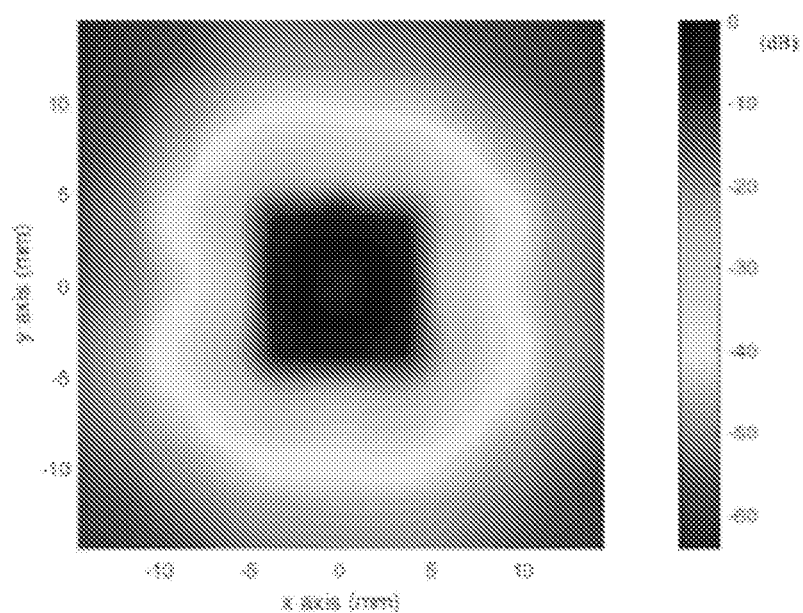
FIG. 5 illustrates the simulated electric field distribution in the xy plane at z=1 mm.

Imaging systems are characterized based on their ability to clearly resolve two adjacently placed targets. The spatial resolution of the proposed imaging probe is determined by its near-field sensing area (footprint), which in turn depends on the SR geometry. The sensing area can be analyzed by observing the electric field magnitude in the near-field region of the probe. FIGS. 3-5 show the distribution of electric field (magnitude in dB) over the yz, xz, and xy planes in the near field of the probe.

The electric field distribution is symmetric along the two orthogonal axes (x- and y-axes) in the plane of the probe, as shown in FIGS. 3 and 4. The decay of the field along the z-axis is also shown in FIGS. 3 and 4. It can be observed that electric field is more concentrated near the SR structure, while electric field magnitude is relatively weak in the center area of the probe.

FIG. 5 shows the distribution of electric field magnitude in the xy plane at a standoff distance (SOD) of 1 mm away from the surface of the probe. The reduction in the strength of the electric field around the center of the probe is attributed to the field cancellation SR where the electric field vectors have opposite phase in that region. Hence, the field is canceled due to field superposition, which reduces the field strength in that region. This effect is demonstrated by the electric field vector maps in yz plane as depicted in FIG. 6(a). The magnetic field produced by the probe does not exhibit a null in the middle structure since the magnetic field vectors are in phase as demonstrated in FIG. 6(b).

Figure 7:
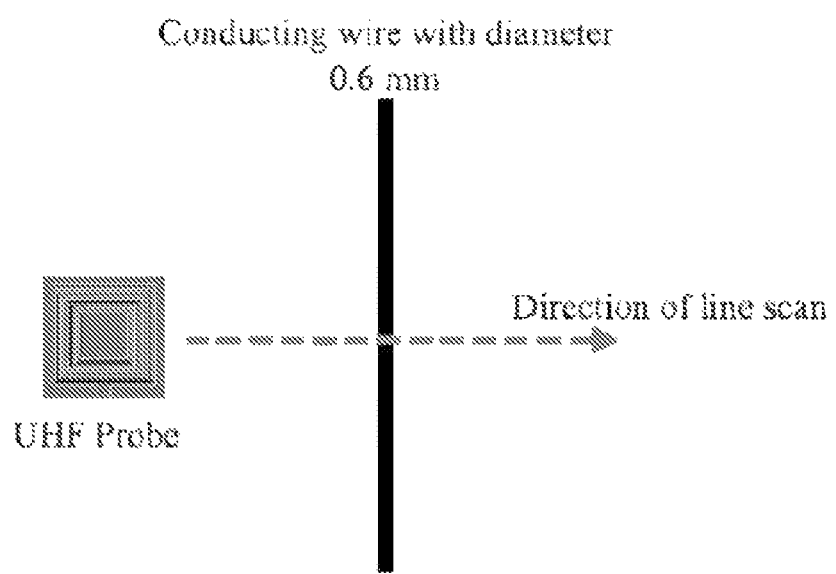
FIG. 7 illustrates the simulation setup for line scan.

The sensitivity of the probe was investigated by scanning a thin conducting wire made out of copper with 0.6-mm diameter in front of the probe at a particular SOD as illustrated in FIG. 7. The reference number 701 represents UHF probe. The reference number 702 represents conducting wire with diameter 0.6 mm. The reference number 703 represents the direction of line scan. The line scans were simulated over 10-mm length with 0.5-mm step size. Extensive simulations were performed to evaluate the dynamic range of the probe in terms of the magnitude and the phase of the reflection coefficient at various SODs. (The magnitude of the reflection coefficient full scale is from 0 to 1, and its phase between ±180°).

Figure 8A:
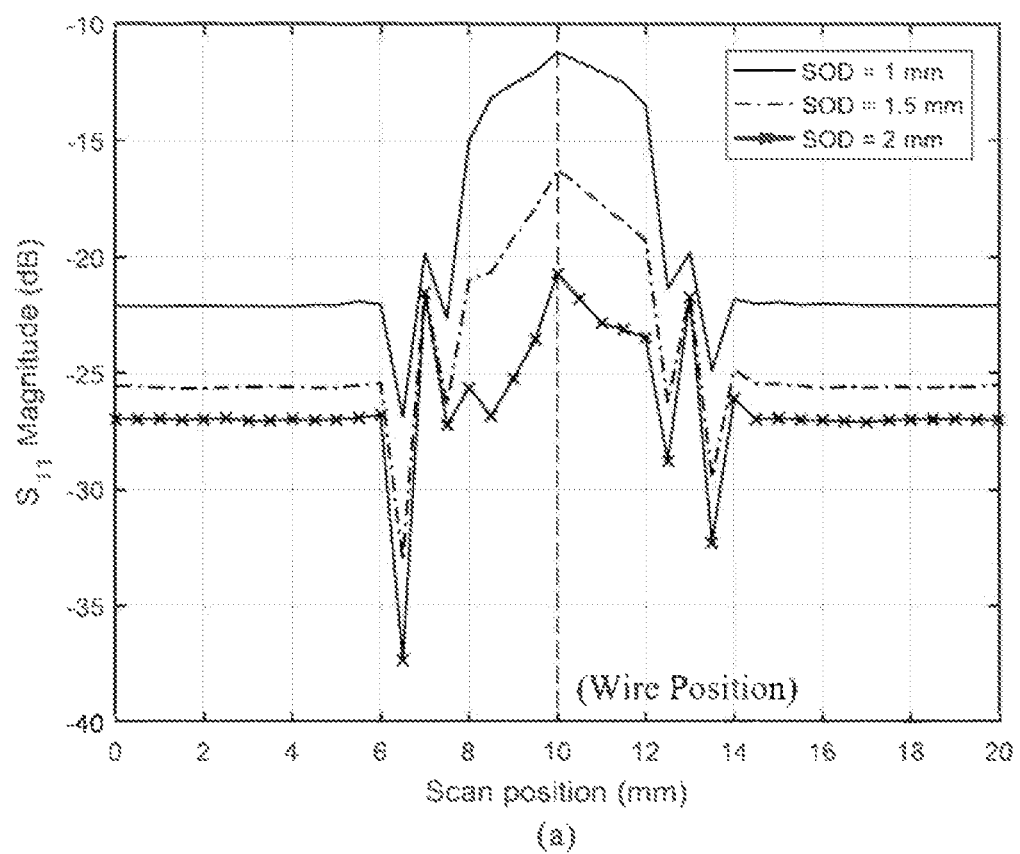
FIG. 8(a) illustrates the simulated magnitude while scanning a single wire target at different SODs.
Figure 8B:
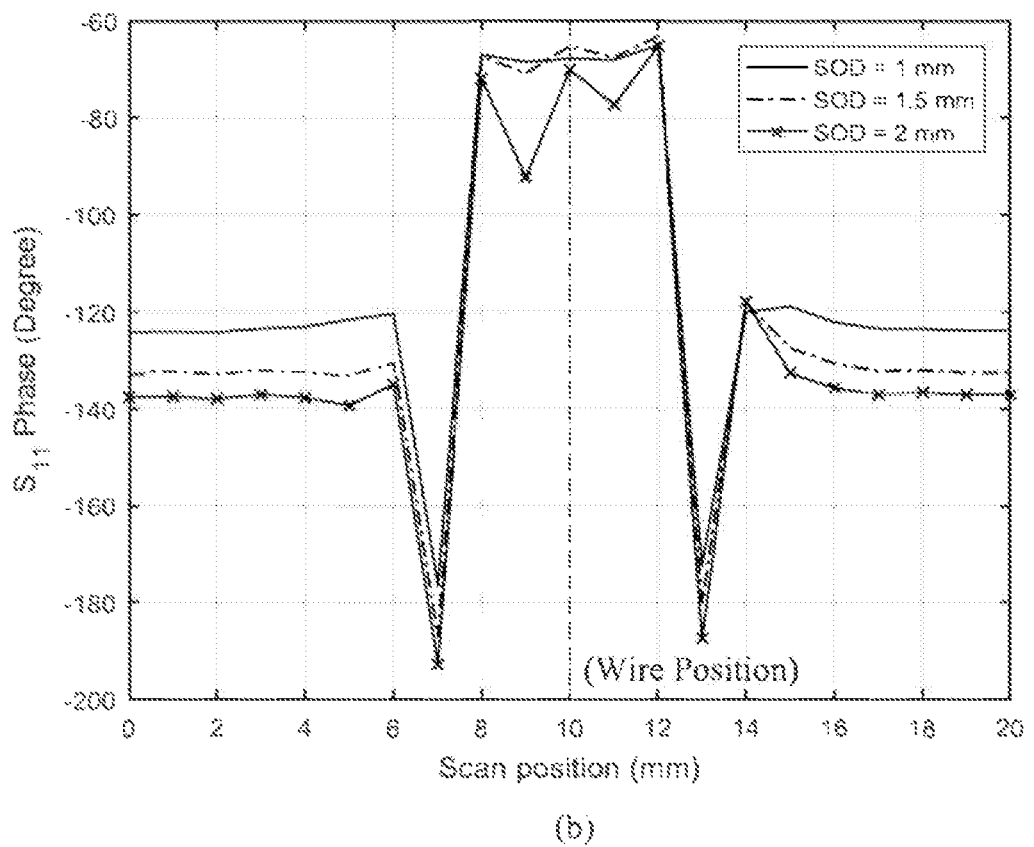
FIG. 8(b) illustrates the simulated phase of the reflection coefficient variation while scanning a single wire target at different SODs.

FIGS. 8(a) and (b) shows the phase and magnitude response of the probe corresponding to the line scans of the wire at different SODs observed at 433 MHz. While a significant change in the magnitude of the reflection coefficient at different SODs was observed, the phase variations were relatively similar for all SODs. The simulation showed a dynamic range of around 10 dB in magnitude and 56° in phase at SOD 1 mm in response to the wire target. The resonance frequency and return loss of the probe will change as a function of the position and material property of the target. However, the frequency point corresponding to minimum return loss while the probe was radiating into free space (i.e., no target), was chosen for calculating the dynamic range. For this target, the shift in resonance frequency was negligible. FIG. 8 shows asymmetric responses for the wire. As it will be shown later, the measured response would actually be quite symmetric. The numerical results were not symmetric primarily because of the mesh adopted in the numerical simulation. The mesh was fine in the SR region and coarse in the middle of the structure. Furthermore, the SR structure is not perfectly symmetric.

FIGS. 8(a) and (b) shows the phase and magnitude response of the probe corresponding to the line scans of the wire at different SODs observed at 433 MHz. While a significant change in the magnitude of the reflection coefficient at different SODs was observed, the phase variations were relatively similar for all SODs. The simulation showed a dynamic range of around 10 dB in magnitude and 56° in phase at SOD 1 mm in response to the wire target.

The resonance frequency and return loss of the probe will change as a function of the position and material property of the target. However, the frequency point corresponding to minimum return loss while the probe was radiating into free space (i.e., no target), was chosen for calculating the dynamic range. For this target, the shift in resonance frequency was negligible. FIG. 8 shows asymmetric responses for the wire. As it will be shown later, the measured response would actually be quite symmetric. The numerical results were not symmetric primarily because of the mesh adopted in the numerical simulation. The mesh was fine in the SR region and coarse in the middle of the structure. Furthermore, the SR structure is not perfectly symmetric.

Figure 9A:
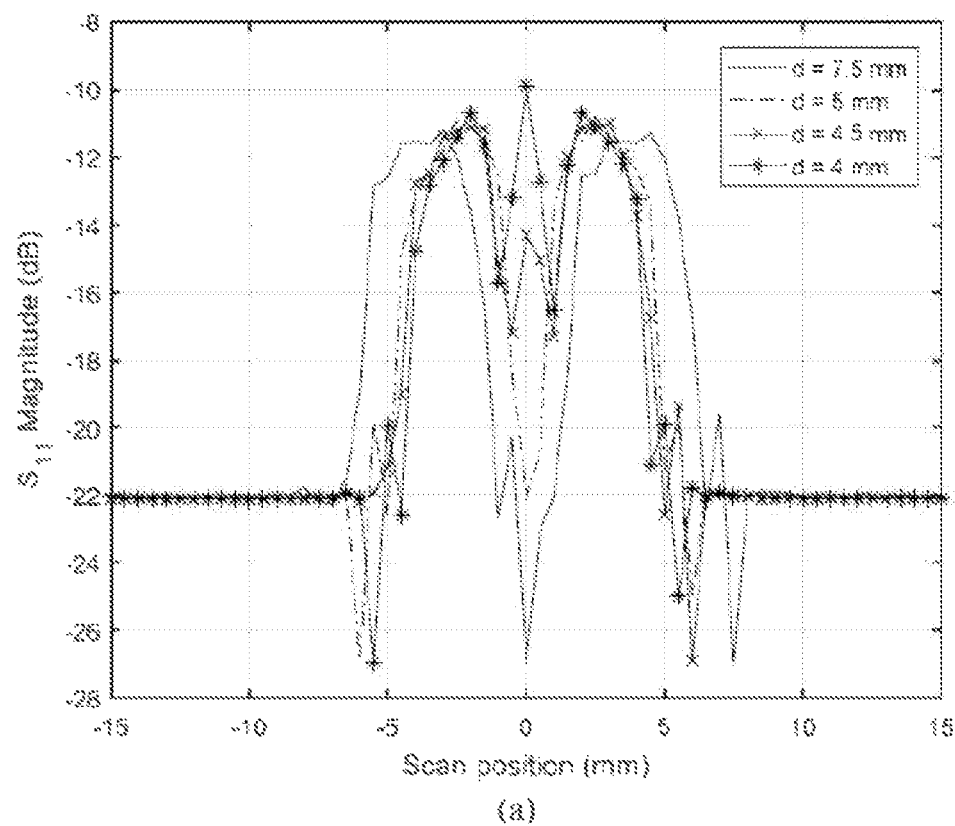
FIG. 9(a) illustrates the simulated magnitude for line scans of two wire targets at different values of interspacing d.
Figure 9B:
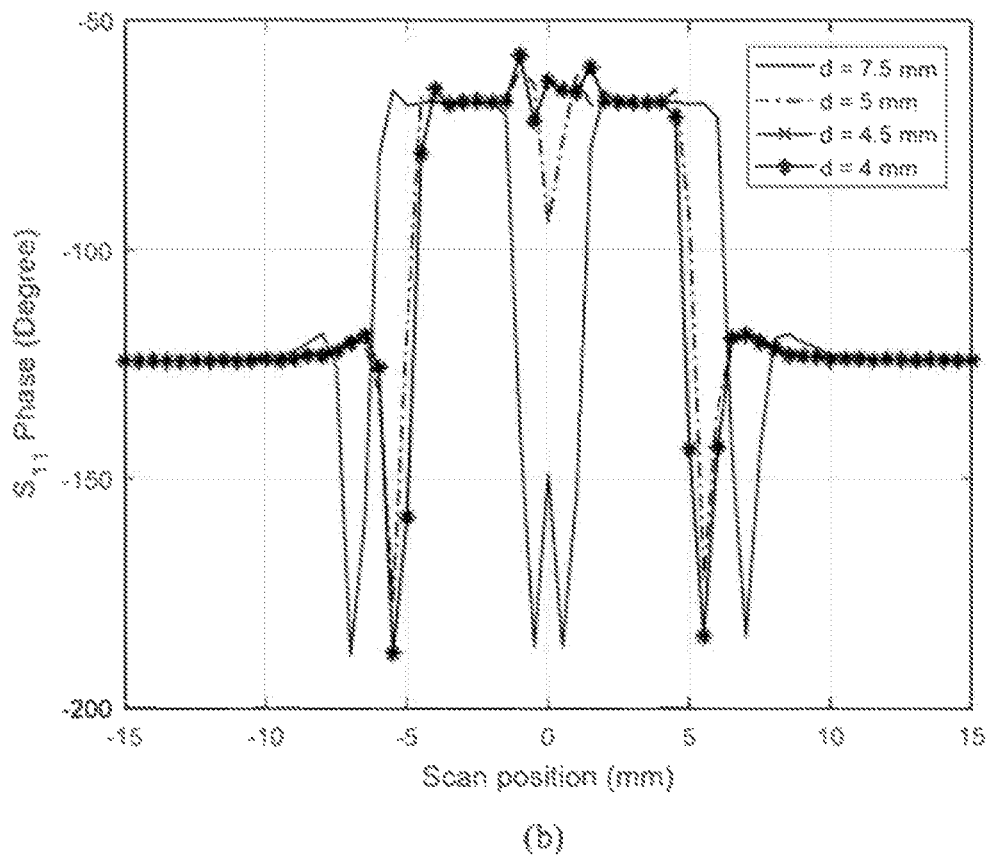
FIG. 9(b) illustrates the simulated phase of the reflection coefficient for line scans of two wire targets at different values of interspacing d.

The spatial resolution of the proposed probe was numerically studied by simulating line scans of two identical copper wires (with 0.6-mm diameter). Line scan simulations were performed while considering varying interspacing distance (d) between the two conducting wires at fixed SOD of 1 mm. The line scan results were obtained over a length of 30 with step size of 0.5 mm. FIGS. 9(a) and (b) shows the results obtained from the simulation in terms of magnitude and phase of the reflection coefficient, respectively. As shown in FIG. 9(a), the probe distinguished the two conducting wire targets when the interspacing distance between the wires was 4.5 mm. The probe showed indications of three targets for d less than 4.5 mm. On the other hand, when the phase response is analyzed [see FIG. 9(b)], the probe clearly detected two targets for d=5 mm. The probe failed to identify two wire targets separately below d=5 mm. Hence, the conservative estimate of the spatial resolution of this UHF probe would be around 5 mm.

Figure 10A:
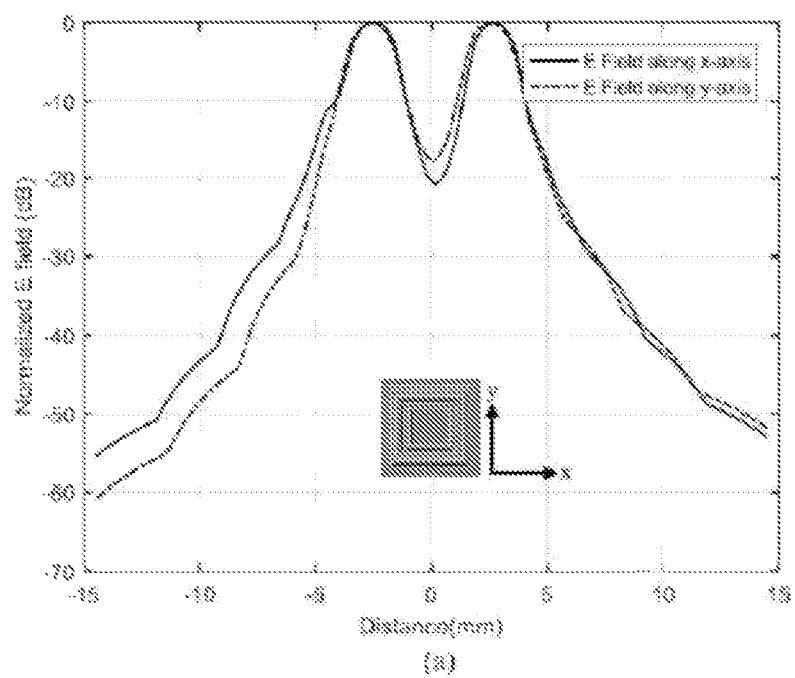
FIG. 10(a) illustrates the normalized electric field distribution along x- and y-axes

In general, the near-field imaging resolution of this probe is related to its near-field distribution as depicted in FIG. 5. FIG. 10(a) shows the variation of the normalized electric field along the x-axis passing through the center of the probe. It is evident that the electric field peaks are separated by around 5 mm. This separation corresponds to the spatial resolution observed from the two conducting wire simulations. It is remarked here that the resolution achieved here at 433 MHz is comparable to the resolution of the rectangular waveguide aperture probe operating at 24 GHz in the K-band frequency range.

Figure 10B:
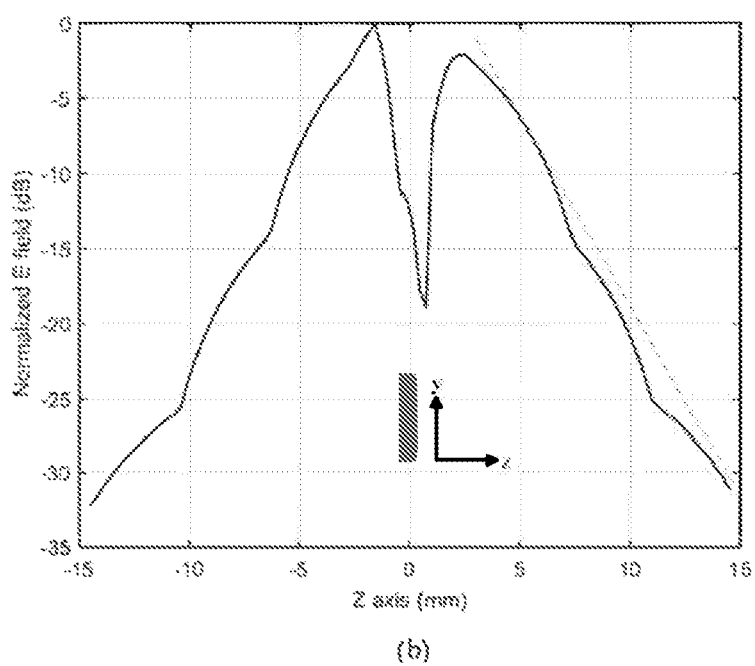
FIG. 10(b) illustrates the normalized electric field distribution along the propagation direction (z-axis) [simulated].

The depth of investigation using the proposed UHF probe and its capability to detect targets placed far from its surface could be assessed based on the behavior of its radiated field as function of distance for the surface. FIG. 10(b) shows the variation of electric field as function of the normal distance to probe's surface. The abrupt change in electric field strength around the center of the probe is attributed to the field cancellation as mentioned earlier. In the positive z-direction, the field peaks at distance of 1.5 mm away from the surface of the probe and then it decays almost exponentially (linear in decibel).

Figure 11A:
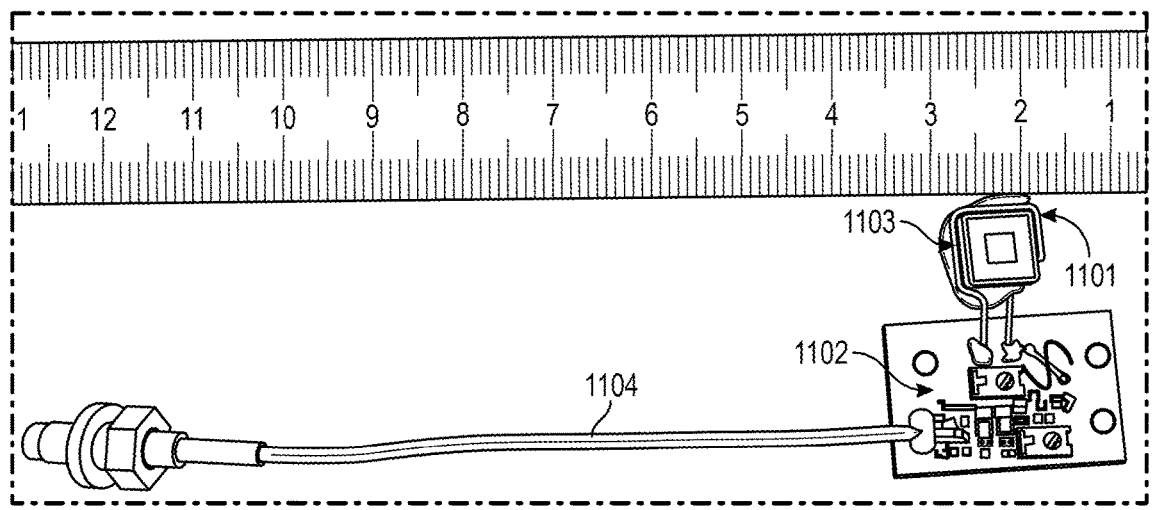
FIG. 11(a) illustrates the fabricated UHF probe prototype
Figure 11B:
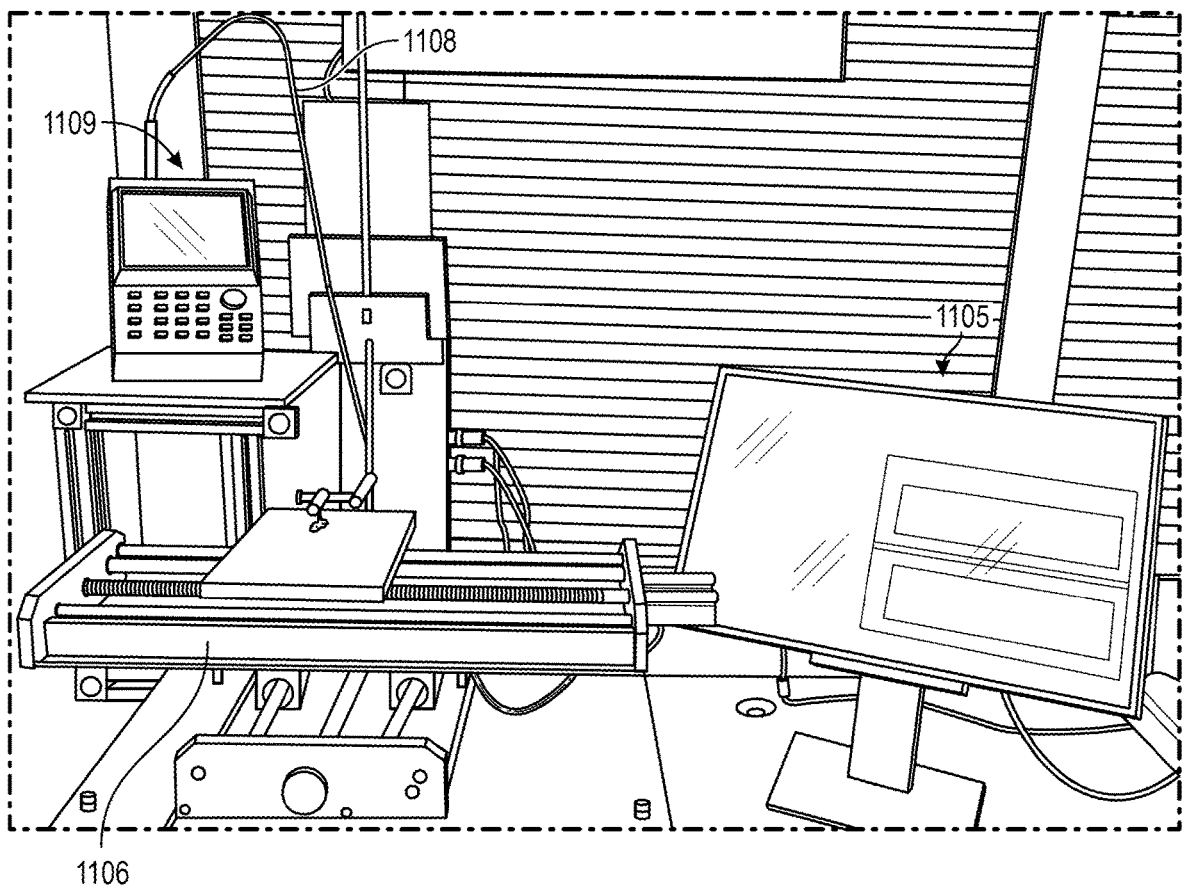
FIG. 11(b) illustrates the near-field imaging setup.

The prototype UHF probe shown in FIG. 11(a) was fabricated on a 1.5-mm-thick Rogers 4350 substrate with 17-µm copper thickness. It consists of square SR 1101 with eight turns similar to the one described above. Two variable capacitors with minimum and maximum capacitance values of 8 and 30 pF were used in the L-matching circuit 1102. Tin coated copper wire was used to form the loop 1103 around SR. The microwave signal is fed into the matching circuit 1102 and the loop 1103 through an SMA coaxial connector. The reference number 1104 represents coaxial feed. The schematic of the imaging setup is depicted in FIG. 11(b). It consists of a Keysight FieldFox 9918A vector network analyzer (VNA) 1109, imaging table, and Cartesian positioning system (scanning table) 1106. The VNA 1109 and the scanning table 1106 are both controlled via a computer program. In all subsequent measurements, the impact of the environment on the probe 1107 was minimized by keeping interfering objects away from the probe during the course of the measurement. The input power to the probe 1107 was set to −10 dBm. Reference number 1105 represents PC with control and acquisition software. Reference number 1108 represents coaxial cable.

Figure 12A:
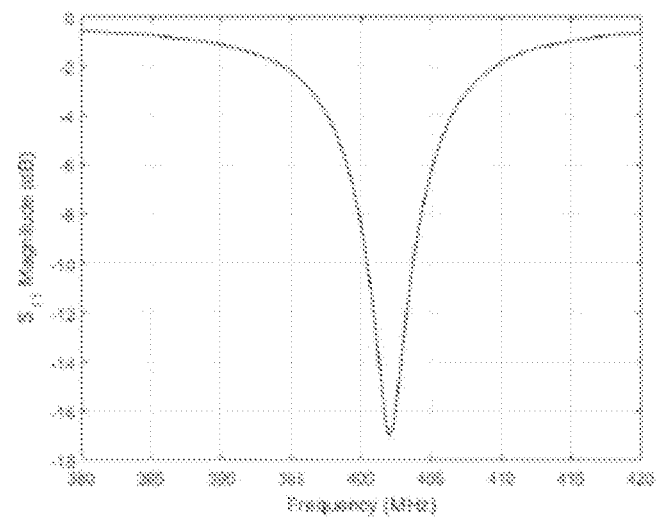
FIG. 12(a) illustrates the measured reflection coefficient of the test loop when placed over the SR

The resonant microwave probes are usually characterized in terms of their resonance frequency and their frequency response over a particular bandwidth of interest. A small test loop was used to characterize the SR experimentally. The test loop was made of a short section of coaxial cable with a balun at the input. The test loop was loosely coupled to the SR and the corresponding frequency response was measured using a VNA as reported in FIG. 12(a). The minimum reflection coefficient in the frequency response obtained at the SR resonance frequency of around 402 MHz corresponds to the maximum energy coupling from test loop to the SR.

Figure 12B:
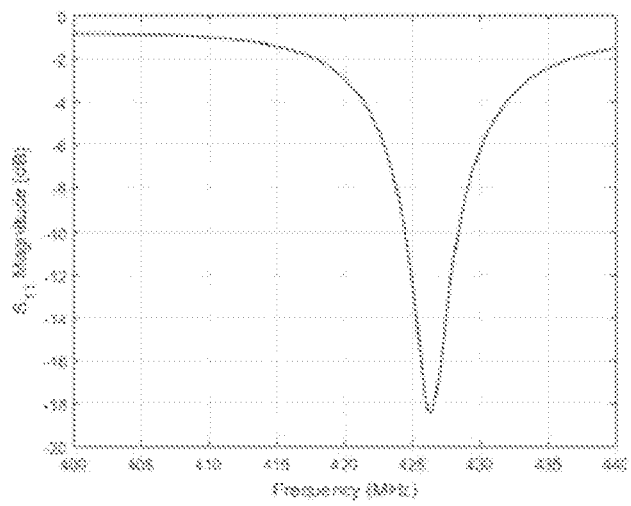
FIG. 12(b) illustrates the measured reflection coefficient of the UHF probe as function of frequency.

FIG. 12(b) shows the frequency response of the proposed UHF probe after the variable capacitors were adjusted to obtain the best possible impedance match given their range of capacitance. The impedance matching was performed when the probe was radiating into air (i.e., unloaded condition). The probe resonates at a frequency of 426 MHz while it is unloaded. The probe's measured resonance frequency was slightly different from the value estimated using simulations (i.e., 433 MHz). The resonance frequency difference between measurements and simulation is around 7 MHz (~1.6%). This is primarily attributed to material and component tolerances as well as manufacturing imperfections.

Figure 13A:
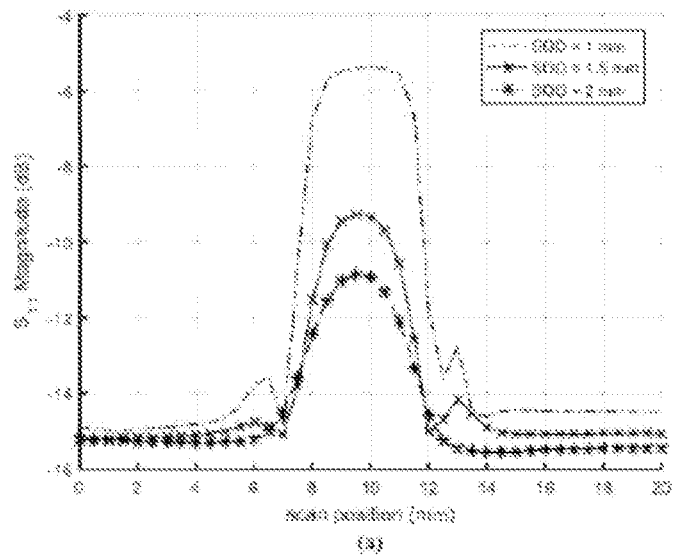
FIG. 13(a) illustrates the magnitude for life scans over a single conducting wire with different SODs.
Figure 13B:
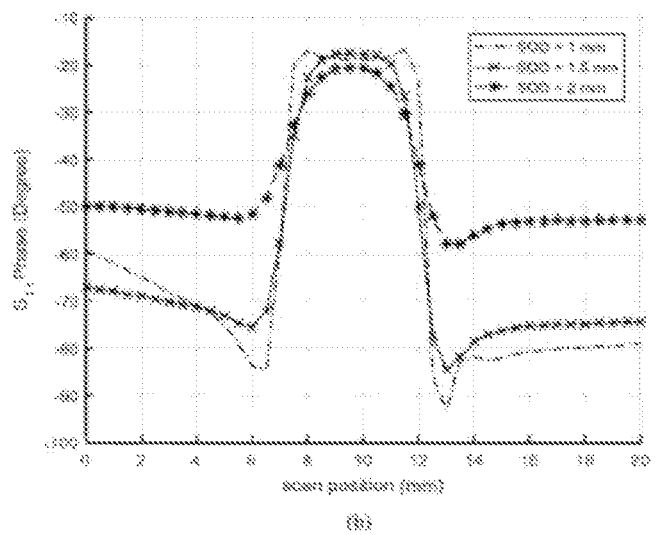
FIG. 13(b) illustrates phase of the measured coefficient for line scan over a single conducting wire with different SODs.

The spatial resolution and the sensitivity of the proposed UHF probe was verified experimentally by measuring the probe's response to copper wire targets of 0.6-mm diameter at various SODs as considered in the simulations. The sensitivity was evaluated by performing line scans at various SOD values over one wire. The near-field imaging setup shown in FIG. 11(b) was used to perform line scan during which the target was moved 20- at 0.5-mm step size in front of the probe. FIG. 13 shows the line scan results in terms of magnitude and phase of the reflection coefficient. The line scan results show a dynamic range of around 10 dB and 60° at SOD=1 mm in terms of both the magnitude and the phase of reflection coefficient, respectively. The magnitude and phase dynamic ranges obtained experimentally are in a very good agreement with the values obtained in simulation. The measured dynamic range for each parameter was also calculated at a single frequency value as mentioned in the case of simulation.

Figure 14A:
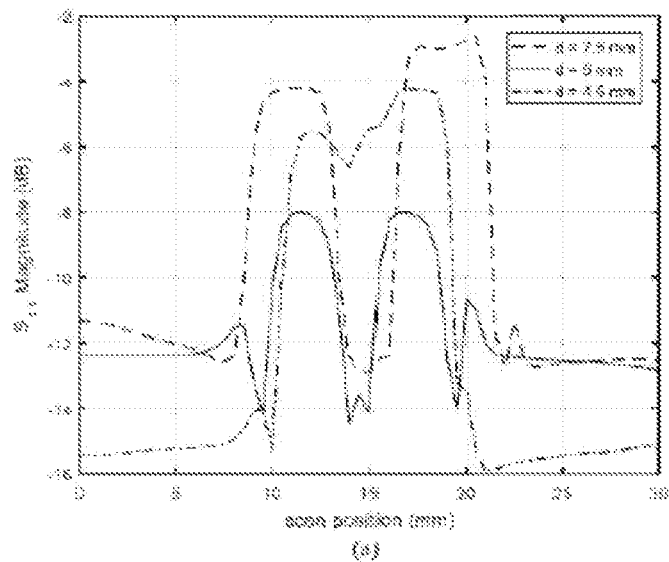
FIG. 14(a) illustrates the magnitude for line scans of two wire targets with different values of interspacing d.
Figure 14B:
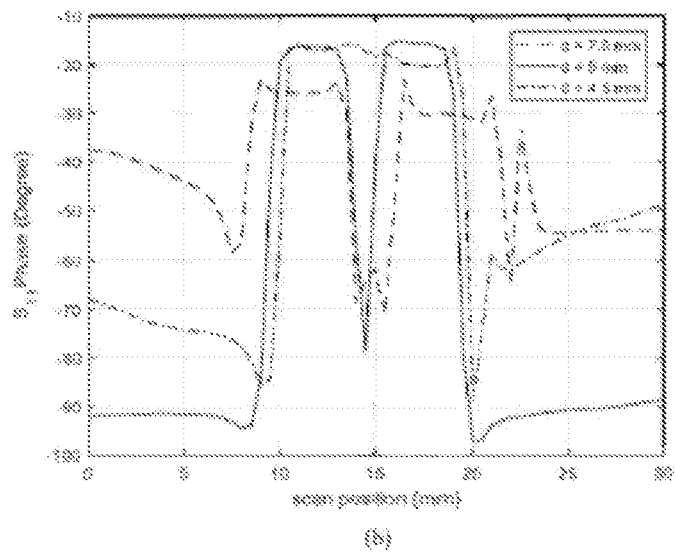
FIG. 14(b) illustrates the phase of the measured reflection coefficient for line scans of two wire targets with different values of interspacing d.

To verify probe's resolution experimentally, two copper wires similar to the ones described in simulations were scanned using the setup, as shown in FIG. 11(b). The interspacing distance d between the conducting wires were changed and SOD was kept at 1 mm. FIG. 14 shows the variation in reflection coefficient magnitude and phase for each line scan obtained with certain interspacing distance. It is evident from FIG. 14 that the spatial resolution of the proposed probe is 5 mm, which is in agreement with the value obtained using numerical simulation.

The utility of the proposed UHF near-field imaging probe depends upon its ability to produce high-resolution images of the SUT with high sensitivity/dynamic range. Here, three different multilayer composite material samples and a corrosion sample are considered for evaluating the practical utility of the proposed probe. The images of all samples were produced through raster scan. The probe was kept at 1-mm SOD for all cases and the VNA was used as transceiver. The raster scan was performed using the same setup used for the line scans (see FIG. 11). The probe was moved over the sample with a step size of 1 mm in all cases. The images of the samples were produced using the magnitude/phase of the reflection coefficient at the resonance frequency observed at the first scan point above the SUT.

To demonstrate the relative capabilities of the proposed UHF probe with respect to the conventional high-frequency microwave probes, the image produced using the proposed probe were compared with the images obtained using a K-band open-ended rectangular waveguide operating at 24 GHz (aperture size 10.67 mm×4.32 mm). The samples were kept at 1-mm SOD from the probe aperture during the raster scan performed using the open-ended rectangular waveguide. A standing wave detector was used with the K-band probe.

Figure 15A:
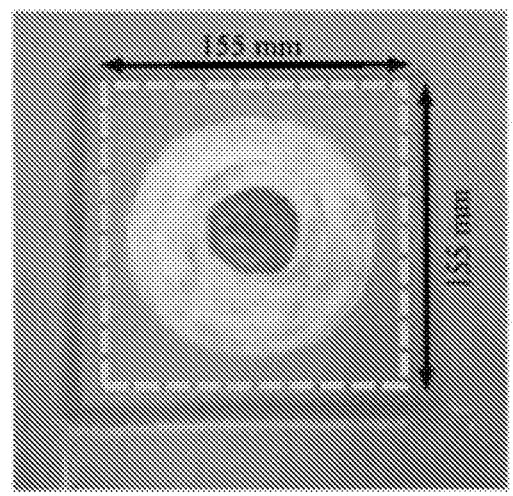
FIG. 15(a) illustrates a photograph of Sample-1.
Figure 15B:
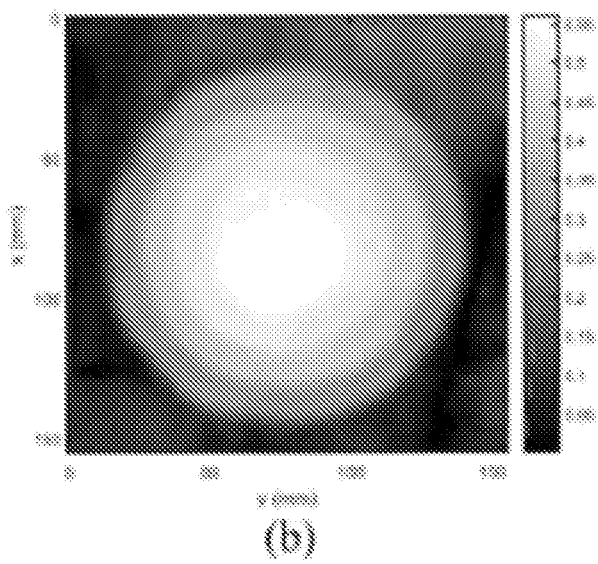
FIG. 15(b) illustrates a photograph of Sample-1, image obtained using proposed UHF probe.
Figure 15C:
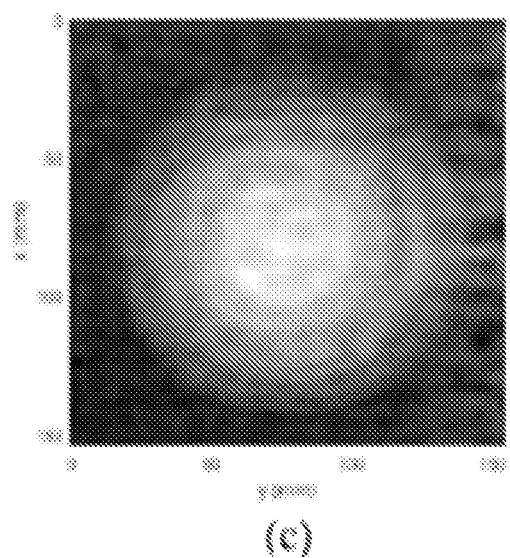
FIG. 15(c) illustrates a photograph of Sample-1, image obtained open-ended rectangular waveguide probe at 24 GHz.

FIGS. 15-18 show the photographs of the samples considered herein along with the images produced by the proposed UHF probe as well as the conventional K-band rectangular waveguide. The first sample (Sample-1) shown in FIG. 15($a$) is a multilayer dielectric composite structure made of a honeycomb core sandwiched between two fiberglass skin laminates with a total thickness of 13 mm. Around the center of the sample, there are several annular rings resulted from deliberate scraping of the skin. Each annular ring is of different depth yielding varying skin thicknesses. At the center, the honeycomb core is completely exposed. This sample emulates skin/adhesive damage of varying severity on the top sample side. The main objective of the imaging method is to detect this damage. FIG. 15($b$) shows the image produced using the proposed UHF probe for the area highlighted, as shown in FIG. 15($a$). The proposed probe produced an image with distinct features representing each annular ring in the sample. In the obtained image, the magnitude of the reflection coefficient dynamic range was around 0.5. On the other hand, FIG. 15($c$) shows the image produced using the rectangular waveguide aperture at 24 GHz. This probe provided faint indications of the boundaries between various annular rings.

Figure 16A:
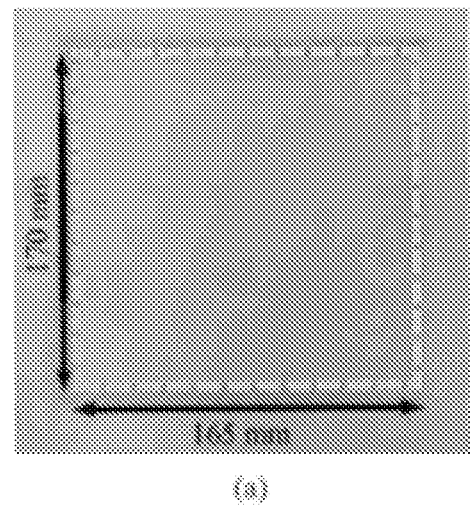
FIG. 16(a) illustrates a photograph of Sample-2.
Figure 16B:
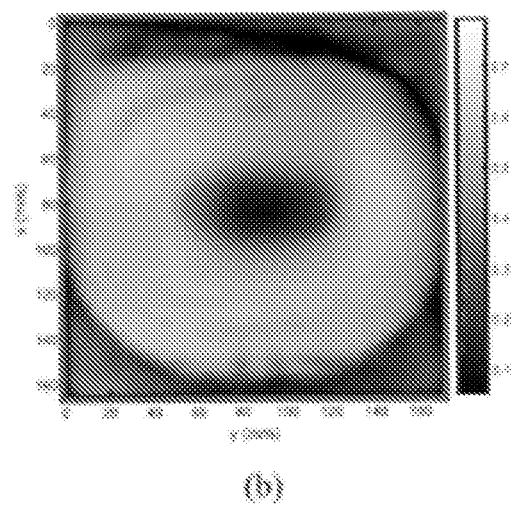
FIG. 16(b) illustrates a photograph of Sample-2, image obtained using proposed UHF probe.
Figure 16C:
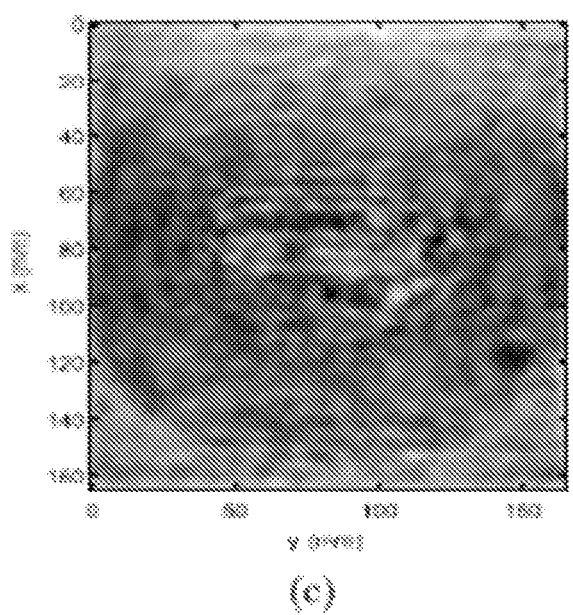
FIG. 16(c) illustrates a photograph of Sample-2, image obtained using open-ended rectangular waveguide probe at 24 GHz.

The second sample shown in FIG. 16($a$) is a multilayer dielectric composite (Sample-2). The sample is made of a honeycomb core sandwiched between fiber reinforced polymer skin laminates with a total thickness of 15 mm. Around the center of the sample, there are three concentric oval rings where the adhesive under the top skin was remove partially (representing a disbond of varying thickness). During manufacturing, the honeycomb core was crushed around an oval ring at the center of the sample. Sample-2 poses practical inspection scenario where the disbond and crushed core are present in the SUT. The images obtained using the proposed UHF probe and the rectangular probe at 24 GHz are shown in FIGS. 16($b$) and ($c$), respectively. Over the scanning area of 170 mm by 165 mm, the dynamic range in the image produced using proposed probe was around 0.6. The proposed probe clearly distinguishes the crushed honeycomb area and produces weak indication of oval ring in the middle. The image produced using the rectangular waveguide aperture probe shows faint indications of each oval ring and the crushed core in the center.

Figure 17A:
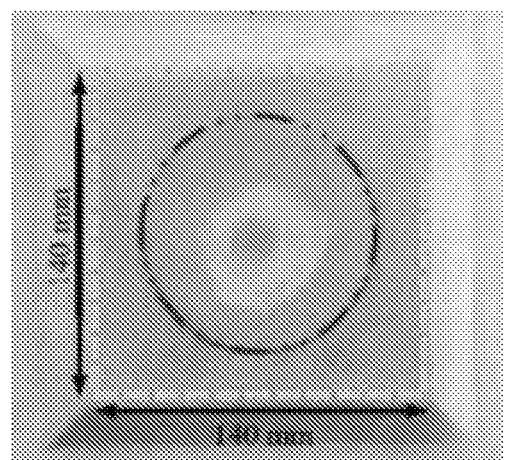
FIG. 17(a) illustrates a photograph of Sample-3.
Figure 17B:
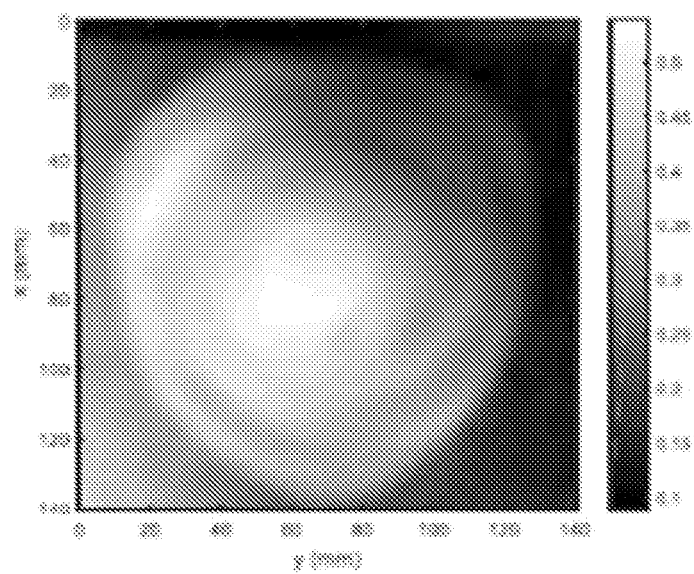
FIG. 17(b) illustrates a photograph of Sample-3, image obtained using proposed UHF probe
Figure 17C:
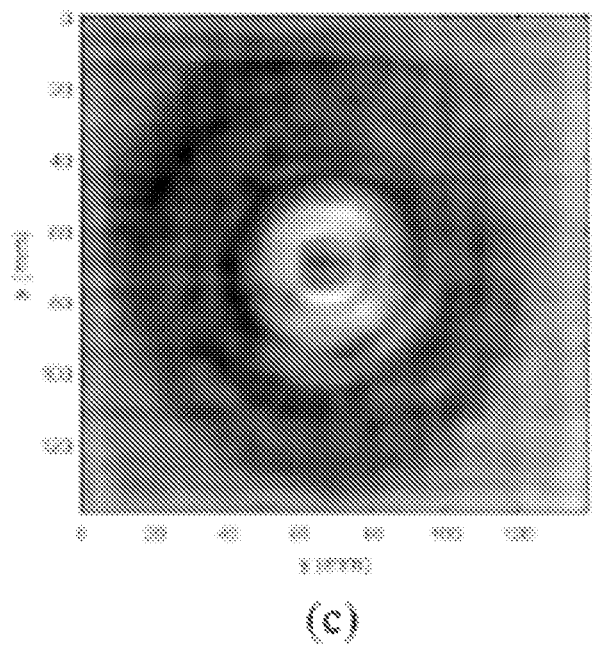
FIG. 17(c) illustrates a photograph of Sample-3, image obtained using open-ended rectangular waveguide probe at 24 GHz.
Figure 18A:
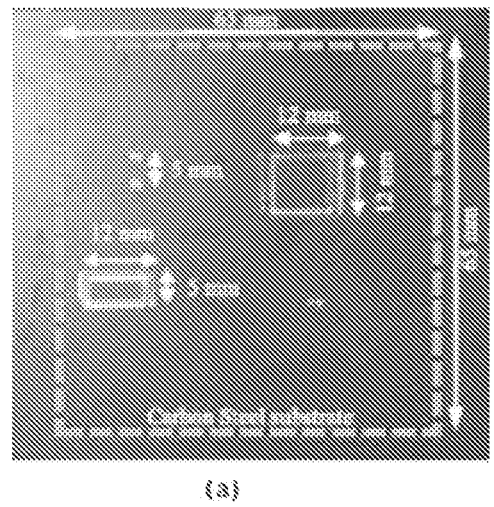
FIG. 18(a) illustrates a photograph of Sample 4.
Figure 18B:
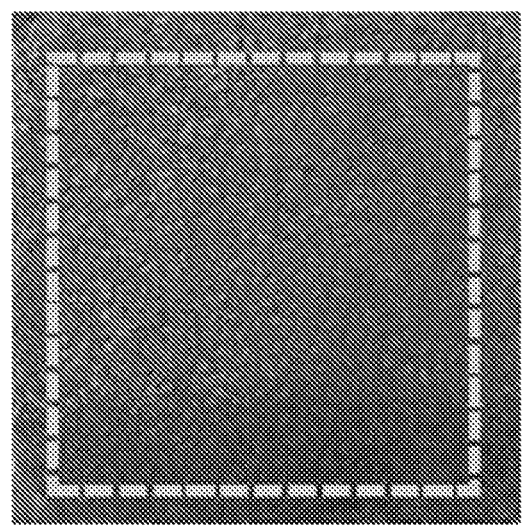
FIG. 18(b) illustrates a photograph of the corroded sample.
Figure 18C:
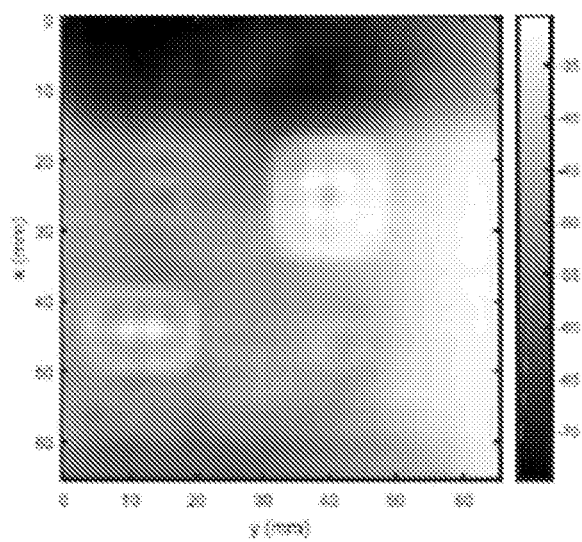
FIG. 18(c) illustrates a photograph of Sample 4, image obtained using a proposed UHF probe
Figure 18D:
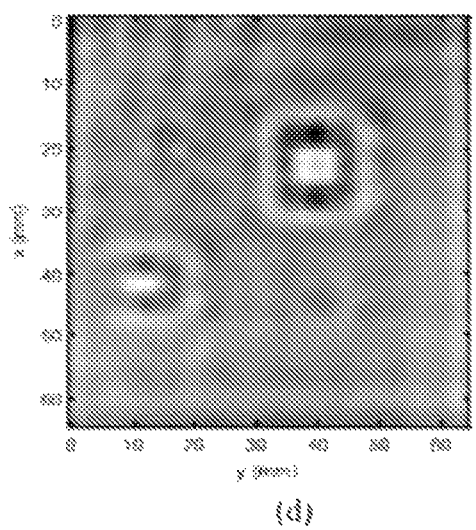
FIG. 18(d) illustrates a photograph of Sample 4, image obtained using open-ended rectangular wave guide probe at 24 GHz.

The third sample (Sample-3) considered in the present invention is shown in FIG. 17($a$). This sample is a thick multilayer composite of foam core sandwiched between fiberglass skin laminates with total thickness of 26 mm. During manufacturing, a defect was created at the center of the sample through the core. Some portion of the fiberglass skin was scraped off around the center (representing skin thickness variation). Also, a delamination between the top skin and the core was created at the center of the sample [annotated as dashed circle in FIG. 17($a$)]. The created delamination has a circular area with a diameter of 105 mm. In effect, this sample presents the case when there are skin damage, delamination between the top skin and the core, and through-core defect at the center. FIGS. 17($b$) and ($c$) shows the images produced using the proposed UHF probe and the K-band rectangular probe, respectively over scanning area of 140 mm by 140 mm. Both probes detected the test defects in this sample. It is remarked here that the image produced using proposed probe suffers from some standoff variation. The dynamic range corresponding to the magnitude of reflection coefficient was around 0.4 in Sample-3 images produced by the proposed probe.

The utility of the proposed UHF probe for inspection applications involving surface defects and corrosion was evaluated through imaging the fourth sample (Sample-4) shown in FIG. 18($a$). The sample is made of carbon steel substrate with artificially created defects that include rectangular and square closed grooves in addition to three flat-bottom holes. All the defects were made with a depth of 0.5 mm. The flatbottom holes were made with a diameter of 2 mm. Also, the groove width of the closed shapes was around 2 mm. After producing the defects in the metallic substrate, the sample was left in natural humid environment to corrode until all defects became almost masked by the corrosion layer [see the photograph of the corroded sample in FIG. 18($b$)]. An area of 65 mm by 65 mm over the corroded sample was imaged using the proposed UHF probe and conventional K-band rectangular waveguide. The images produced using these probes are reported in FIGS. 18($c$) and ($d$), respectively. The image produced using the proposed probe is reported here in terms of the phase of the reflection coefficient. The phase information of the reflection coefficient was used for this sample since the dynamic range in terms of magnitude was masked by standoff variation. As shown in FIG. 18($c$), all the defects present in the corroded sample were detected using the proposed UHF probe with a dynamic range of around 35°. With reference to FIG. 18($d$), while the rectangular waveguide probe detected the closed grooves, it did not produce clear indications of the flat-bottom holes.

As demonstrated by imaging the practical samples, the UHF probe operating around 426-MHz produced images that compare favorably to those obtained with rectangular waveguide probe operating at 24 GHz. The proposed probe yielded high dynamic range in terms of the magnitude of the reflection coefficient for the composite samples and the phase of the reflection coefficient for the surface corrosion sample.

A novel UHF near-field imaging probe which offers an imaging resolution on the order of few millimeter was proposed and its performance was thoroughly evaluated in this research. The proposed probe design is based on small loop antenna loaded with SR. The spatial resolution of the probe as well as its sensitivity was evaluated using simulations and measurements. Furthermore, an UHF probe prototype was used herein for near-field imaging of practical multilayer dielectric samples and corrosion sample. The imaging results reported in terms of the magnitude and/or phase of the reflection coefficient showed adequate dynamic range to detect the defects in each sample. Moreover, the images produced by the probe were compared with the images obtained using an open-ended rectangular waveguide probe at 24 GHz in the K-band. The comparative analysis demonstrated the potential of the proposed UHF probe for near-field microwave imaging applications.

In the following, an array element based on the spiral-loaded loop introduced above will be described. A first-ofits-kind one-dimensional array of open resonators will be described and its operation will be demonstrated.

Figure 19A:
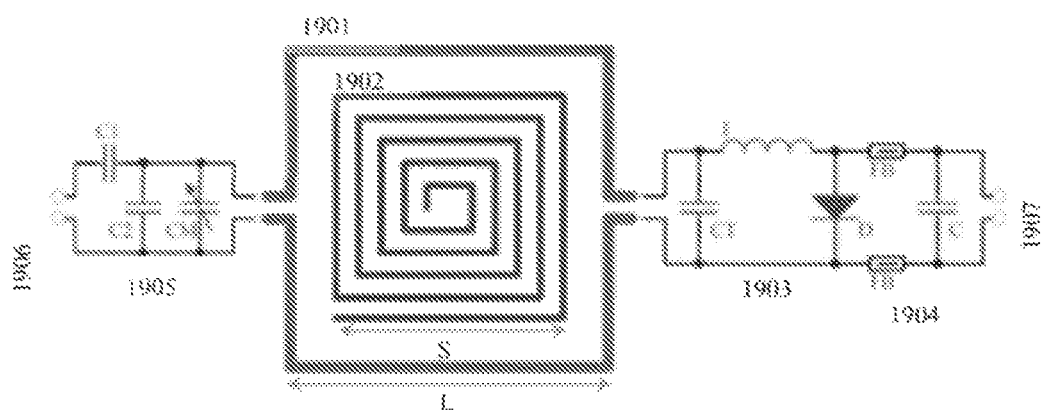
FIG. 19(a) illustrates a simplified schematic of the probe.
Figure 19B:
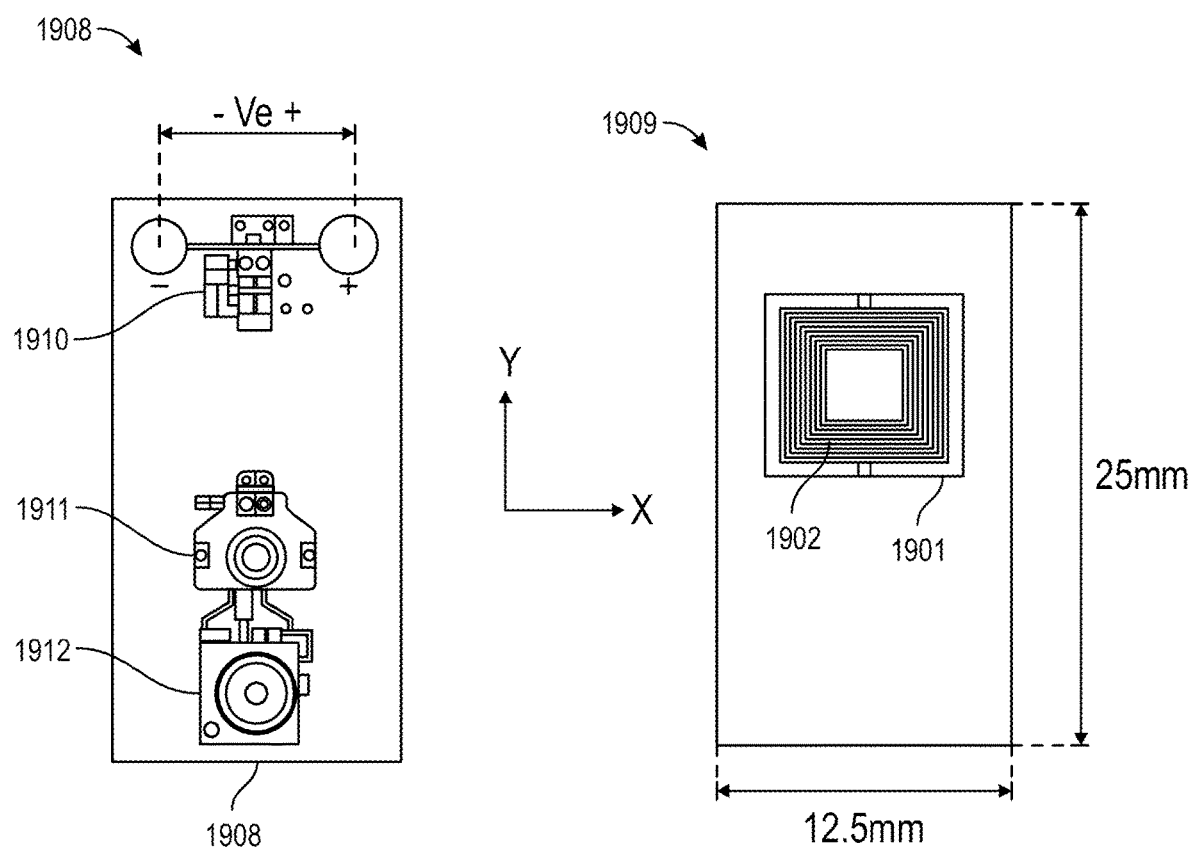
FIG. 19(b) illustrates photographs of the prototype

The proposed imaging probe consists of a small loop antenna 1901 loaded with spiral resonator (SR) 1902 similar to the one developed as above described. FIG. 19(*a*) shows a simplified schematic of the proposed probe. An L-matching circuit 1905 is used to match the probe to 50 Ohm at the measurement port 1906. Herein and without loss of generality, a square-shaped spiral resonator (SR) 1902 of side length S and number of turns N is considered for developing the near-field imaging probe in the ultra-high frequency band. The selection of the SR 1902 as a resonator provides for adequate miniaturization rate at the lower end of the microwave frequency range. The SR 1902 provides higher miniaturization rate compared to other resonant structures. The SR 1902 will resonate at a frequency, $f_s$, that is determined by the SR geometry (and dielectric material of the substrate it is built on). Also, the SR 1902 could be excited with a single port which reduces the complexity and cost of the system. To this end, the SR excitation is achieved using a small loop antenna 1901 of side length L placed around the SR 1902 as shown in FIG. 19(*a*). The loop antenna 1901 creates a magnetic field perpendicular to the loop plane which contains the SR 1902. Consequently, the magnetic field produced by the loop antenna 1901 will induce a current in the SR conductor. In effect, the flux linage is maximized between the loop antenna 1901 and the SR 1902. The excitation loop side length L is much smaller than the operating wavelength, and consequently, the loop itself is not resonant (it is primarily inductive). However, the combined structure of the loop 1901 and the SR 1902 resonates in the UHF range.

The proposed imaging probe described above is with a loaded active element to effectively modulate/control its response. Modulating/controlling the response of the probe with such circuit will reduce the mutual coupling (cross-talk) between the array elements considerably as it is demonstrated later. Furthermore, it allows tagging the signal from the probe when multiplexing is used.

The schematic displayed in FIG. 19(*a*) shows the element loaded with PIN diode (D). An LC resonant detuning circuit 1903 with a PIN diode is used to control the probe response.

Referring to FIG. 19(*a*), when the PIN diode (D) is in the on-state (forward biased), it represents a minimal resistance (e.g., 5Ω). In the off-state (reverse biased), the PIN diode impedance is approximately capacitive with minimal capacitance (e.g., 0.018 pF). The PIN diode state is controlled by the dc control voltage ($V_c$) 1907. A positive voltage at certain current puts the diode in the on-state, and a negative voltage (or zero) put it in the off-state. The voltage to the detuning circuit 1903 is supplied through a filter 1904 consisting of two ferrite beads (FB) and high decoupling capacitor (C). This filter 1904 circuit ensures adequate isolation between the RF and dc parts of the system.

In the on-state, the inductor L and capacitor $C_T$ form a parallel resonant circuit with a resonance frequency $f_{dt}$. At this frequency, the impedance of the circuit is very high (ideally, infinity). Consequently, in the on-state, the feeding loop is open circuited and the probe does not resonate. In the off-state, the PIN diode presents a very high capacitive impedance at the frequency of operation, and hence, the detuning circuit 1903 becomes isolated from the antenna. The LC detuning circuit 1903 resonance frequency is selected such that it is close to the resonance frequency of the probe. Effectively, with the PIN diode load, the antenna can be switched on and off.

The developed prototype consists of an eight-turn square SR with a side length of 7 mm. A small square loop of side length 8.1 mm is designed around the SR to excite it. The loop is made of 0.508-mm copper strips, and SR is made of 0.127-mm copper strips. The interspacing between the strip conductors is 0.127 mm. A 1.5-mm thick printed circuit board (PCB) with Rogers 4350 substrate was used to build the probe.

FIG. 19(*b*) shows photographs of the top 1908 and bottom layer 1909 of the manufactured prototype. The SR 1902 and loop 1901 conductors are laid on the bottom layer 1909. Two pair of vias are used to connect the antenna to the top PCB layer where the matching and tuning components are mounted. The values of the used components are reported in Table II. The variable matching capacitor $C_M$ allows for optimizing the matching for the probe response.

TABLE II

| \multicolumn{7}{c}{Prototype component values} |
| $C_1$ (pF) | $C_2$ (pF) | $C_M$ (pF) | $C_T$ (pF) | L (nH) | C (uF) | FB (Ω) |
| --- | --- | --- | --- | --- | --- | --- |
| 10 | 10 | 8-30 | 10 | 24 | 0.22 | 2.2k |

The self-resonance frequency of SR 1902 was measured before adding the components (i.e., the feeding loop is open-circuited) using a test loop loosely coupled to the SR 1902. The measurement was accomplished by evaluating the magnitude of the reflection coefficient, $|S_{11}|$, as a function of frequency for a test loop when it was placed over the SR (i.e., the test loop's magnetic field was orthogonal to the SR plane). In the FIG. 19(*b*), reference number 1910 denotes detuning circuit & filter. Reference number 1911 denotes Var-Cap. Reference number 1912 denotes MMCX RF Connector.

Given the material and geometry of the probe, the resonance frequency can be predicted using the equivalent circuit model or numerical EM simulation as disclosed above. The self-resonance frequency of the SR was measured to be around $f_s$=420 MHz. The designed loaded probe resonates around $f_r$=320 MHz.

By design, the resonance frequency of the detuning circuit, $f_{dt}$ is selected (by setting the appropriate inductor value L) to be close to $f_r$ (that is: $f_{dt}=1/(2\pi\sqrt{LC_T})\cong f_r$). This insures the effectiveness of the detuning as it sets the impedance of the detuning circuit to its highest value at the frequency of operation.

All components are surface mounted on the top layer and connected to the loop through the vias. Small surface mount packages (~1.0 mm×0.5 mm) were used for all capacitors and 50 Ohm MMCX RF connector 1912 was used to excite the loop as shown in FIG. 9(*b*). In this prototype, Macom MA4AGFCP910 PIN diode was used in the detuning circuit. This diode is turned on by applying a voltage $V_c$=3.3 V with 10 mA of drive current and turned off by applying $V_c$=0 V. In the on-state, the diode has a forward resistance of around 5Ω. In the off state, the diode represents a capacitance of 0.018 pF (a capacitive impedance greater than 270 kΩ at 320 MHz). When the diode is off, the probe resonates normally at 320 MHz. When the diode is on, the probe does not resonate. The control voltage $V_c$ is applied across the biasing pads on the top layer as shown in FIG. 19(*b*).

Figure 20A:
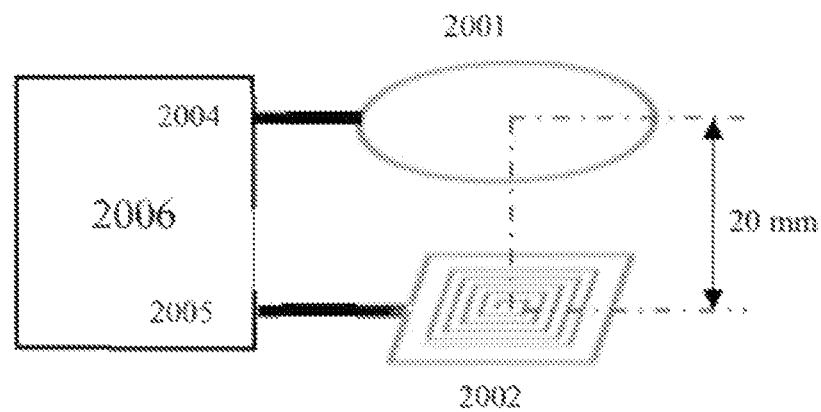
FIG. 20(a) illustrates detuning effectiveness measurement setup.
Figure 20B:
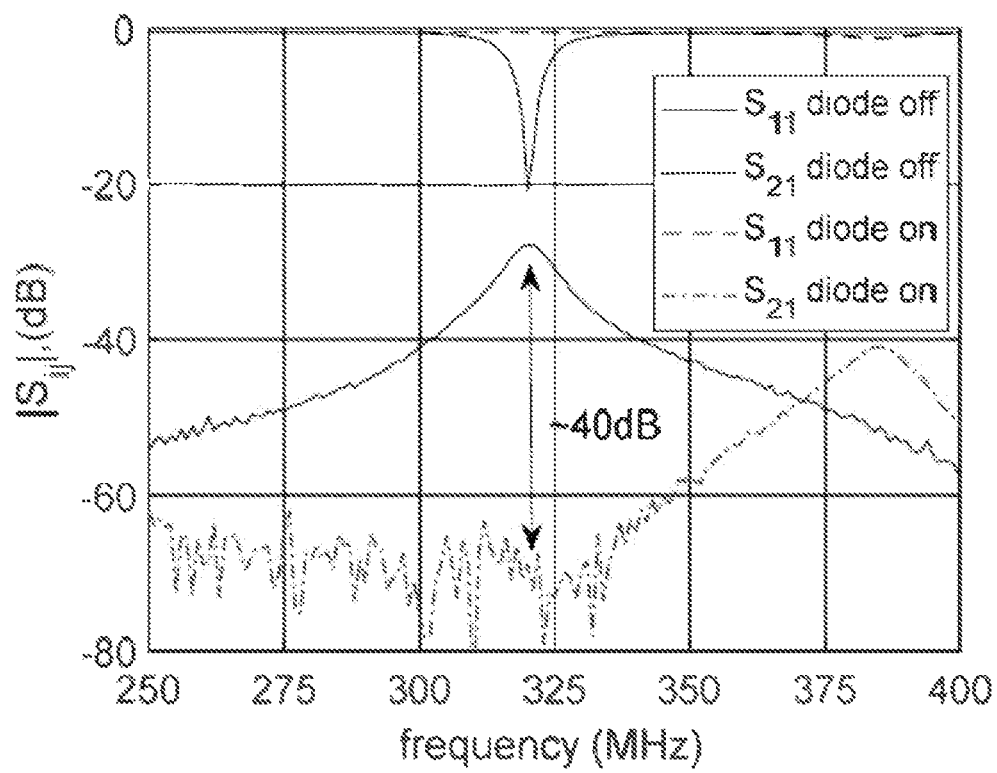
FIG. 20(b) illustrates the magnitude of reflection and transmission coefficients as a function of frequency with ON and OFF diode states.

The realized loaded probe 2002 was tested using the setup shown in FIG. 20(*a*). The loaded probe 2002 was connected to port 1 2004 of the Keysight N5225A Vector Network Analyzer (VNA) 2006. A small test loop 2001 (diameter of 15 mm) was connected to port 2 2005 and placed at 20 mm above the proposed probe 2002. Both the test loop 2001 and the proposed probe 2002 are centered at the same axis. The proposed probe 2002 was matched and tuned at 320 MHz while the PIN diode was turned off. The setup shown in FIG. 20(*a*) allows testing the effectiveness of the detuning circuit in the reflection and transmission mode. To this end, the reflection coefficient ($S_{11}$) at the input of the loaded probe 2002 was measured under diode on and off states. Similarly, the transmission coefficient from the loaded probe 2002 to the test loop ($S_{12}$) 2001 was measured at both diode states.

The measured magnitudes of these coefficients are reported in FIG. 20(*b*) as a function of frequency. When the diode is off, the probe is functioning normally and exhibits a low reflection at 320 MHz. Also, the signal is transmitted through it to the test loop antenna. When the diode is turned on, the probe is switched off where it exhibits a very high reflection, and almost no signal is transmitted through it to the test loop. In the transmission mode, the isolation is measured as the difference between the transmission coefficients in the on and off states (in dB). In this particular case, the isolation is more than 40 dB as annotated in FIG. 20(*b*). Evidently, the designed detuning circuit is very effective since the yielded isolation is very high.

To form an image with a single probe, the probe has to scanned mechanically around the object over given imaging space (e.g., plane) with predetermined step size. This mechanical scanning is time-consuming especially when the scan area is large. To reduce the scan time, one-dimensional (1D) array could be constructed using the proposed probe element. The array could be scanned on the orthogonal direction to form a 2D image. In such linear imaging array, each element provides a measurement of the signal received from the object at the element's location. The image is formed by spatially indexing one or more of the characteristics of the signals (e.g., phase, magnitude) in the intensity map as afore-mentioned.

High-resolution near-field imaging requires compact arrays where the elements are placed in very close proximity to each other. With such proximity, strong coupling will be established between the elements. This strong coupling cause mode splitting, and consequently, the elements cannot be matched and tuned independently. Loading the probe with PIN diodes enables electronic switching of the probe as detailed above. Thus, the coupling between the array elements can be conveniently dealt with using the detaining circuit. By detuning all elements in the array except one a time, the array can be used effectively to produce 1D line scans.

Figure 21A:
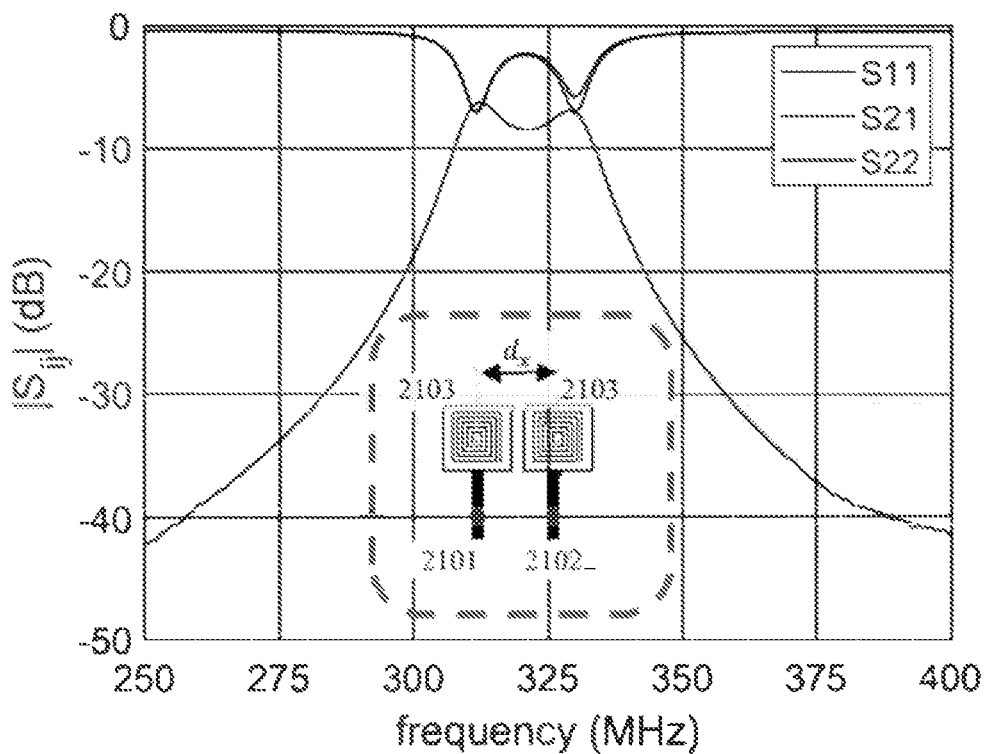
FIG. 21(a) illustrates two-element array when both elements are active.
Figure 21B:
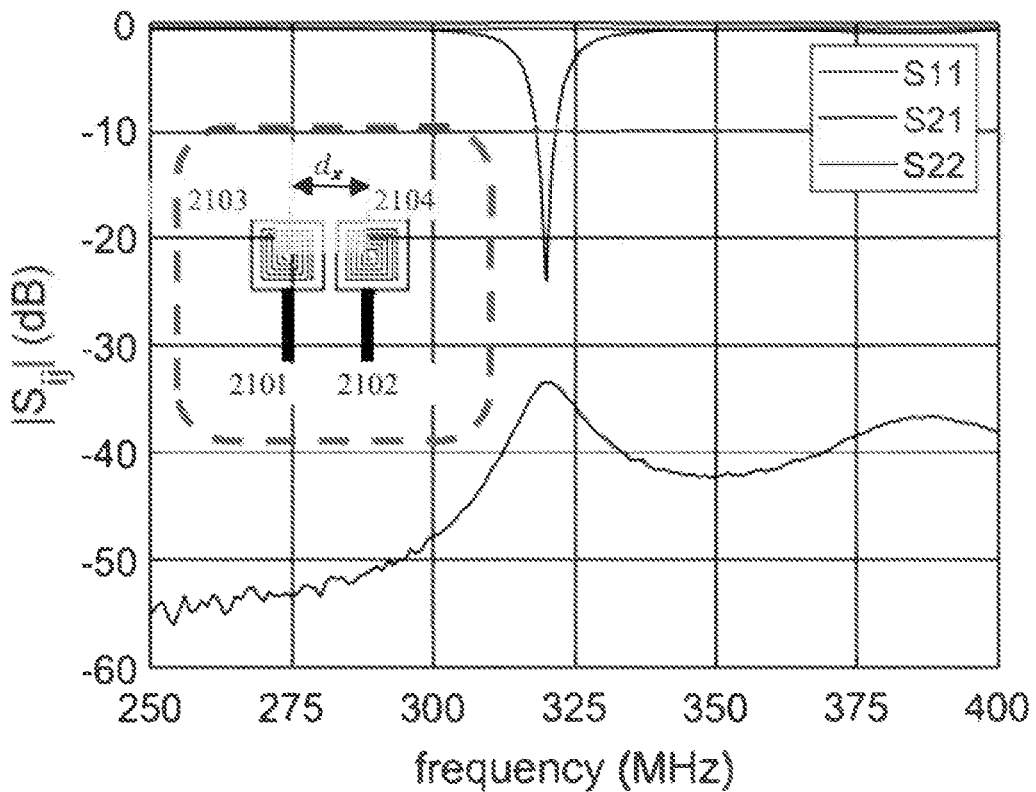
FIG. 21(b) illustrates two-element array when one element is detuned.

To demonstrate the effectiveness of detuning method in reducing the mutual coupling, two identical PIN loaded probes as the one shown in FIG. 19(*b*) were assembled and tuned at 320 MHz while isolated from each other. After independent matching and tuning, the probes were placed side by side with an interspacing distance of $d_x$=9.14 mm as shown in the inset of 21. One of the antennas was connected to port 1 2101 of the VNA and the other was connected to port 2 2102. The reflection coefficient of the first probe ($S_{11}$), the second probe ($S_{22}$), and the transmission coefficient between both probes ($S_{21}$) were measured when the PIN diodes were off for both probes (both probes are active) as reported in FIG. 21(*a*). Mode splitting when both probes are active is evident from the two dips in the $S_{11}$ response. The coupling as manifested by the fact that $|S_{21}|$ between the probes is very high (around 6 dB). When both probes are active, they are tightly coupled, and it becomes difficult to tune and match each one independently. When the PIN diode in the second probe was turned on (the probe is detuned) while keeping the first probe active, the coupling between the probe reduced to around 34 dB as shown in FIG. 21(*b*). In this state, the first probe can be tuned and matched as desired. In the FIG. 21(*a*) and FIG. 21(*b*), reference number 2103 denotes "active". Reference number 2104 denotes "detuned".

Figure 22:
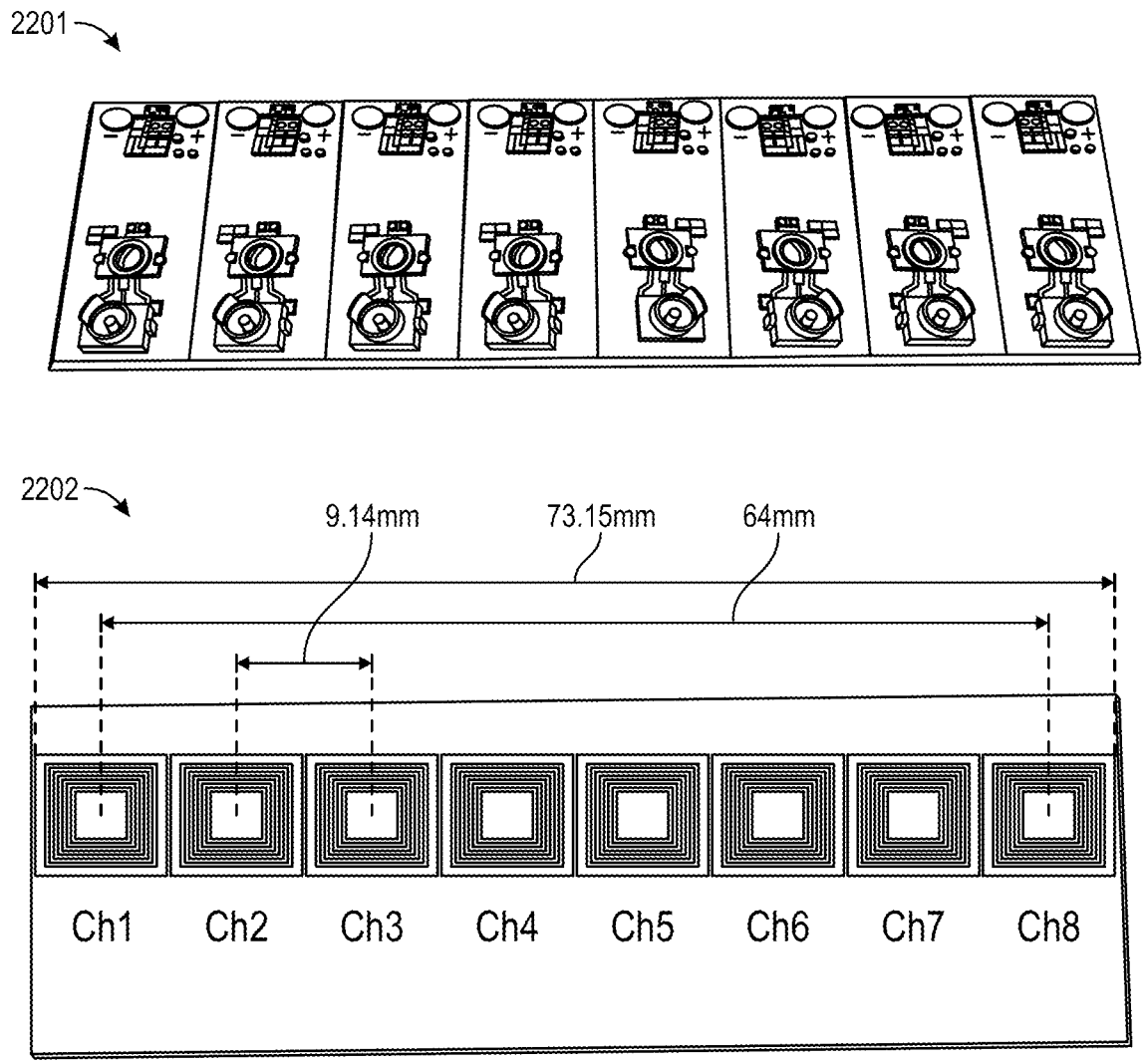
FIG. 22 illustrates photograph of the assembled UHF array.

An eight-channels linear array was realized using the proposed loaded probe. Eight identical elements to the one shown in FIG. 19 were arranged on the x-axis with uniform interspacing of 9.14 mm. FIG. 22 shows photographs of the top 2201 and bottom layers 2202 of the assembled array. The total array length is around 73 mm. Each detuning in the array can be controlled independently by applying the appropriate voltage across the PIN diode.

Figure 23A:
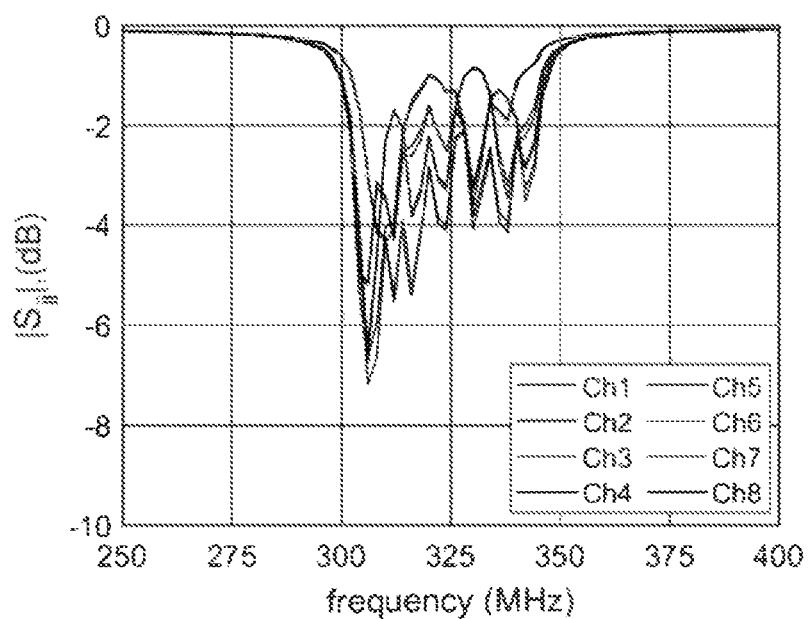
FIG. 23(a) illustrates array elements reflection response with all elements are active.
Figure 23B:
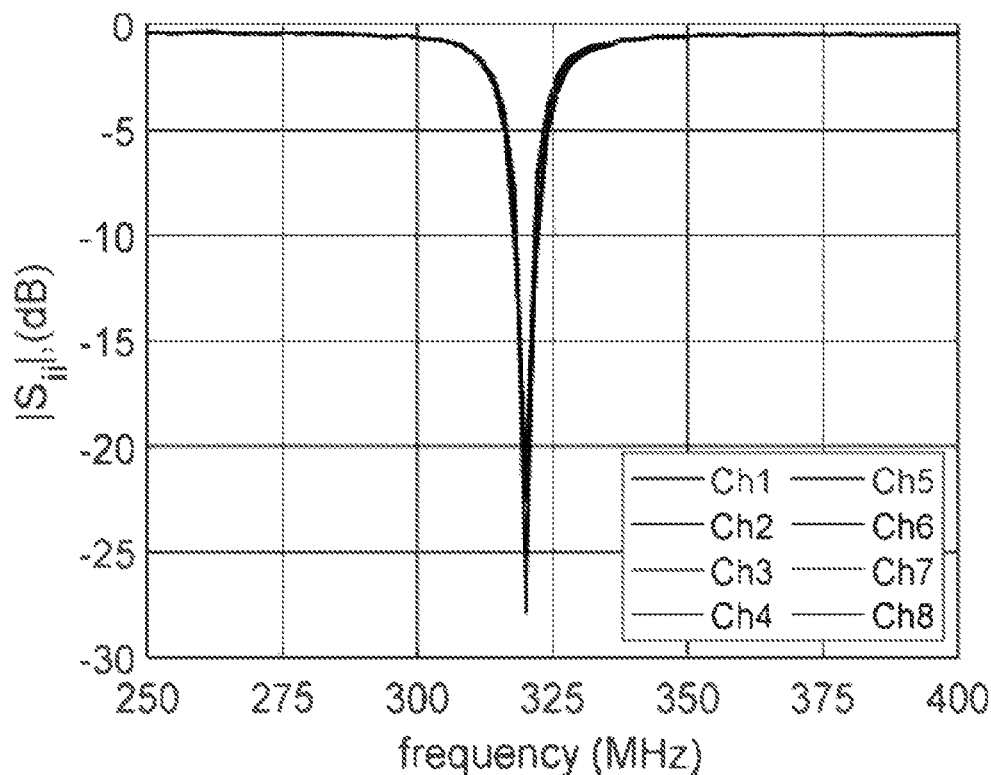
FIG. 23(b) illustrates array elements reflection response with one element is active at a time.
Figure 23C:
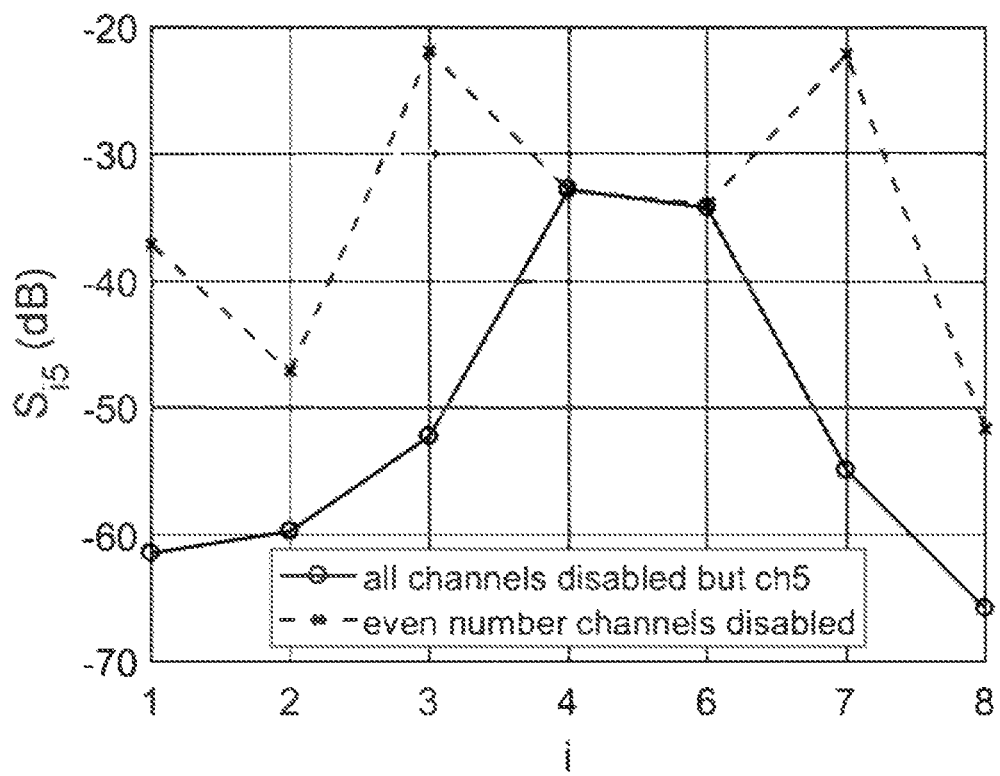
FIG. 23(c) illustrates array elements reflection response with transmission coefficient between channel 5 and all other channels at 320 MHz when channels are detuned but 5 and when even numbered channels are detuned.

The realized array was fully characterized by measuring the reflection coefficient at the input of each channel as well as transmission coefficients between the channels. The reflection coefficient at the input of each element was measured using VNA when all elements are active (all PIN diodes are turned OFF). In this case, the elements coupled to each other and the reflection response shows sever mode splitting as shown in FIG. 23(*a*). Thus, the array cannot be matched, and consequently, it cannot be used for each imaging. However, when a particular element is made active at a time by turning ON all PIN diodes except for that element, the desired reflection coefficient response is obtained as shown in FIG. 23(*b*) where each element is matched and tuned at 320 MHz.

In essence, the array can be operated by activating the elements sequentially. In this case, the mutual coupling between any given element and the remaining elements is mainlined at a deficient level. For instance, the mutual coupling is below 32 dB between the 5th element and all other elements when the 5th element is active and the rest are detuned as shown FIG. 23(*c*). Alternatively, the array can be operated with next-neighbor detuning only. For examples, channels 1, 3, 5, and 7 can be active at the same time while the remaining channels are detuned. The inter-element mutual coupling with will be also very low as reported in FIG. 23(*c*). In this mode, multiple channels can be acquired simultaneously at any given imaging point.

Figure 24:
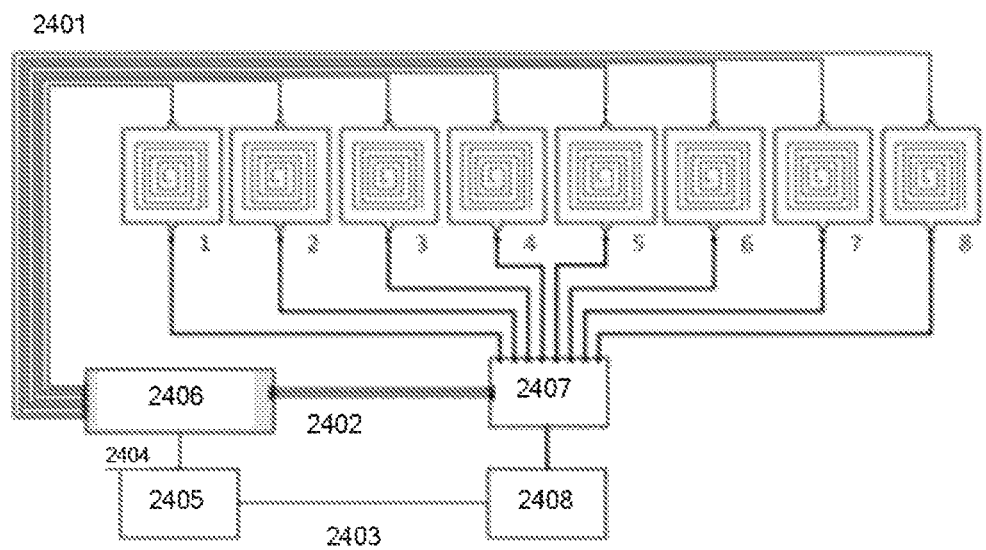
FIG. 24 illustrates a simplified diagram of the imaging array system.

To demonstrate the functionality of the realized array in an imaging system, the array was connected to a commercial 1-to-8 switch (Analog Device HMC253QS24) such that the reflection at the input of one element can be measured at a time. The eight terminals of the switch are connected to the eight array elements. The common switch terminal is connected to the VNA 2408. A simplified diagram of the system is shown in FIG. 24. The PC 2405 controls the switch 2407 and PIN diodes through a digital output module 2406 connected via USB 2404. A computer program was written to control the switch 2407 and array PIN diodes such that a given element is activated (while the rest are disabled) and the common port of the switch is connected to that given element. The VNA 2408 measures the reflection coefficient of the element and sends the measurement to the PC through a GPIB link 2403. This process is repeated for all eight elements at a given imaging point, and the image is formed using the magnitude of the measured reflection coefficient. Reference number 2401 denotes element control. Reference number 2402 denotes switch control.

Once placed on top of a subject of interest, the 1D array provides a line scan of length 64 mm sampled along the x-axis (array axis) by 9.14 mm in less than 23 ms using the available hardware. 2D images can be formed by scanning the array along the y-axis. Smaller step size along the array axis can be used to fill in the data points between the elements.

Figure 25A:
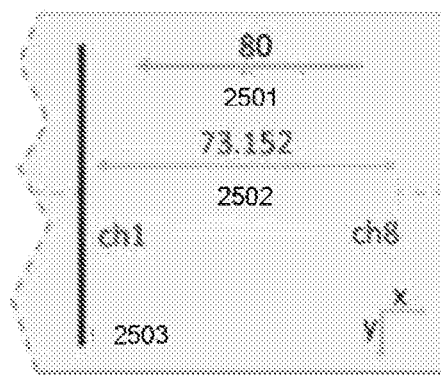
FIG. 25(a) illustrates wire line with x-axis scan configuration.
Figure 25B:
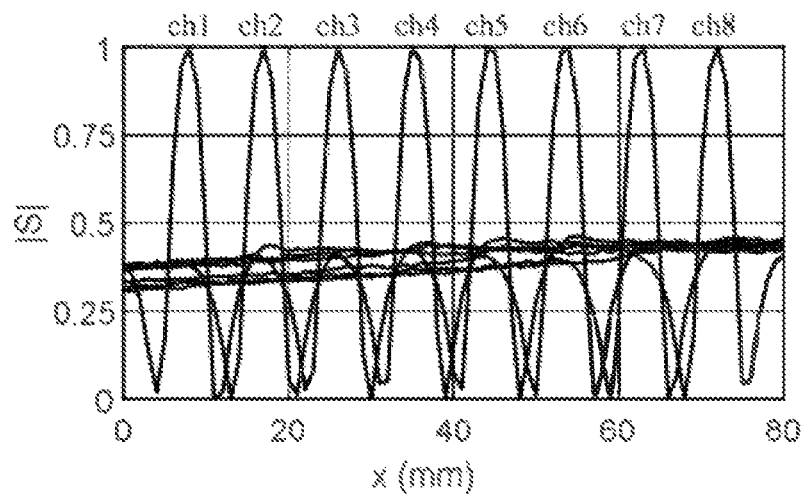
FIG. 25(b) illustrates wire line x-axis scan result.

Since the elements are resonant, it is imperative that produce similar responses whenever they interact with the same target. This goal was accomplished by matching all the elements to the same frequency as shown in FIG. 23(b). To investigate the elements responses in the designed array, the array was used to scan a thin wire target (0.38 mm diameter) placed along the y-axis as shown in FIG. 25(a). A positioning system was used to move the wire under the array elements while the distance between the target and array (i.e., standoff distance) was fixed at 1 mm. The scan was performed for 80 mm such that the wire traverses under all elements with a step size of 1 mm. At each scan position, the elements were made active sequentially, and the reflection coefficient was measured for each active element. FIG. 25(b) shows the normalized response of each element as a function of the scan position along x-axis. It is evident that the elements produced a similar response as desired. The response of each element attains its peak when the wire position along the scan direction x-axis coincides with the center of the element.

Figure 25C:
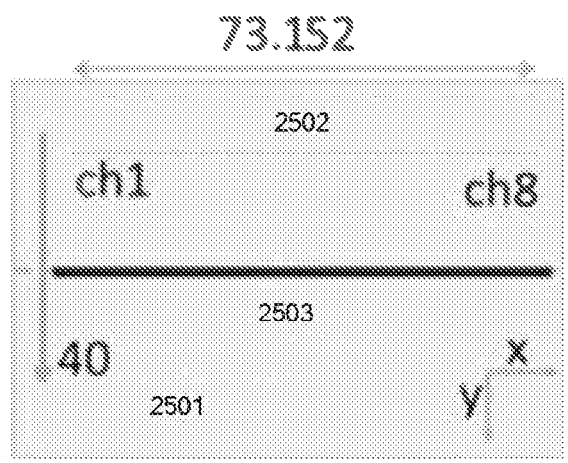
FIG. 25(c) illustrates wire line with y-axis scan configuration.
Figure 25D:
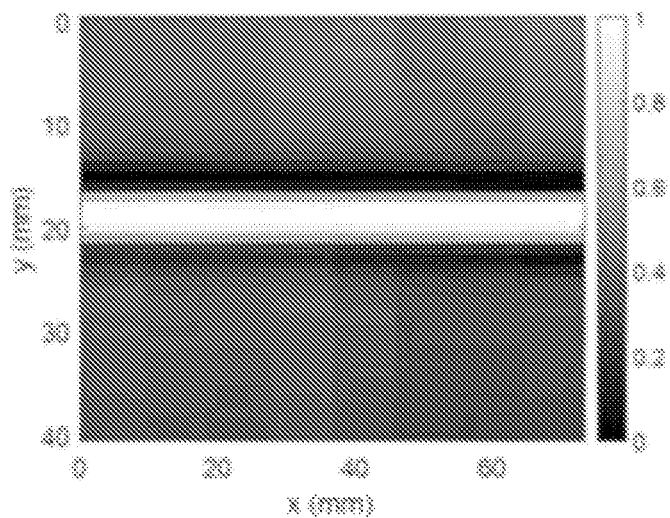
FIG. 25(d) illustrates wire line y-axis scan result.

A simple line scan along the y-axis using the array produces a 2D image with the step size of 9.14 mm along the array direction. To demonstrate this functionality, the wire considered above was positioned along the x-axis and the array used to scan in along the y-axis for 40 mm as shown in FIG. 25(c). In this setup, a step size of 1 mm was along the scan direction and a standoff of 1 mm was set as previously. FIG. 25(d) shows the obtained 2D image with clear indication of the wire. It is remarked here that the wire in the obtained image seem wider because the resolution of the UHF element is around 5 mm.

To assess the performance of the developed array for a detailed 2D imaging in multiple target scenarios, a 2D target consisting of multiple copper strips of width 6 mm was raster scanned. As annotated in the sample diagram of FIG. 25(e), the strips were made of varying lengths and placed parallel to the x-axis with varying interspacing. The sample was raster scanned in XY plane with a scan area of 80 mm×80 mm with a step size of 1 mm in both directions and with a standoff distance of 1 mm. With the developed array, it was required to scan a total of 9 steps only to cover the entire x-axis span of the imaging area with a step size of 1 mm. FIG. 25(f) shows the obtained 2D image for the copper strip sample where all the targets are clearly identified. As expected, all the elements responded similarly to the 80-mm strip.

Figure 25E:
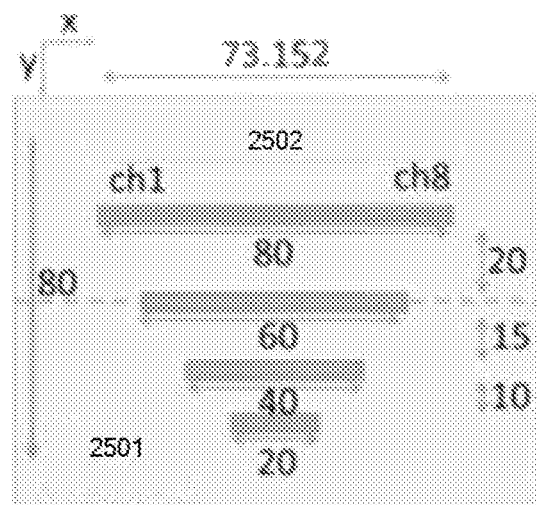
FIG. 25(e) illustrates copper strips 2D scan sample.
Figure 25F:
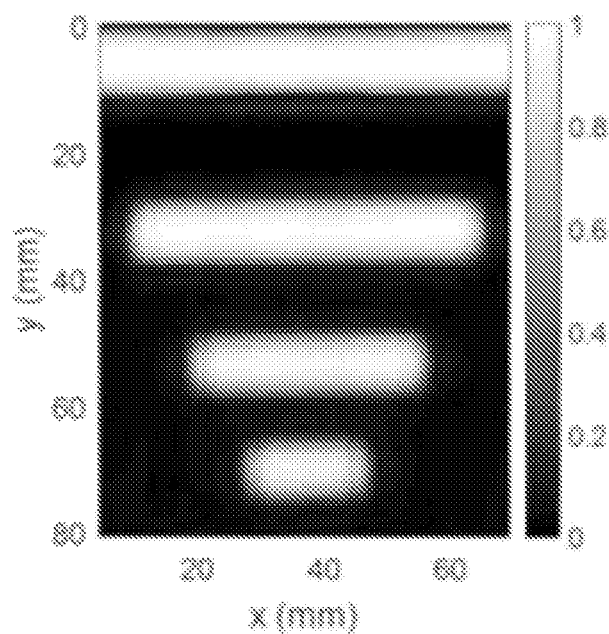
FIG. 25(f) illustrates 2D image of the copper stripes sample.

In FIG. 25(a), FIG. 25(c) and FIG. 25(e), reference number 2501 denotes scan direction and reference number 2502 denotes 8 elements UHF array.

Figure 26A:
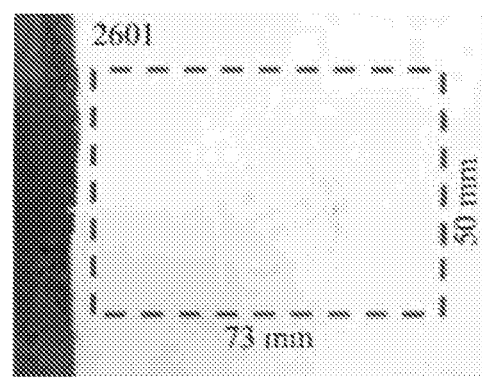
FIG. 26(a) illustrates photograph of the localized corrosion specimen covered with paint.
Figure 26B:
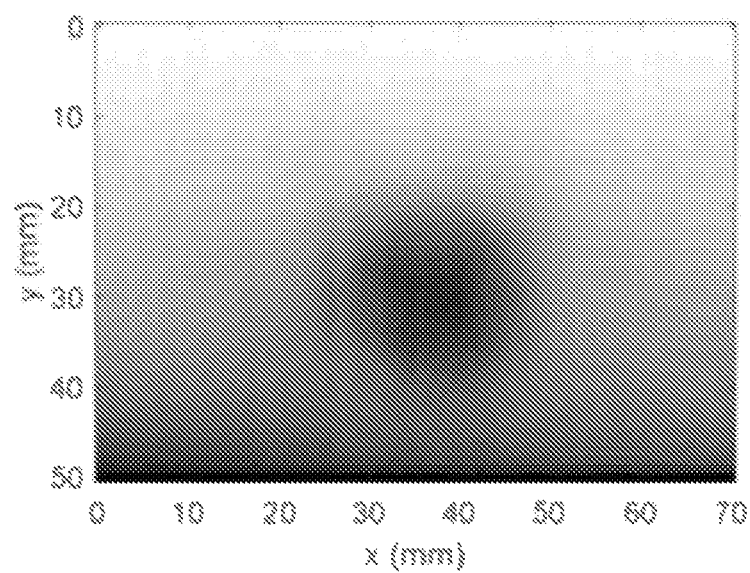
FIG. 26(b) illustrates photograph of image produced using the proposed UHF array.

The efficacy proposed UHF array for near-field imaging is highlighted on practical corrosion sample. A carbon steel substrate with localized corrosion under a thin layer of paint was imaged using the probe. A photograph of the sample after applying the paint is shown in FIG. 26(a). A 2D raster scan is performed over an area of 73 mm×50 mm with a standoff distance of 1 mm and step size 1 mm in both directions. Reference number 2601 denotes scan area. It is evident from FIG. 26(b) that the developed array detected the corrosion under the paint and rendered clear indication of its spatial extent. The obtained image using the proposed array is, in fact, comparable to the images produced for the sample using 24 GHz circular aperture probe, 33.5 GHz rectangular aperture, as well as phased array ultrasonic image.

Figure 27A:
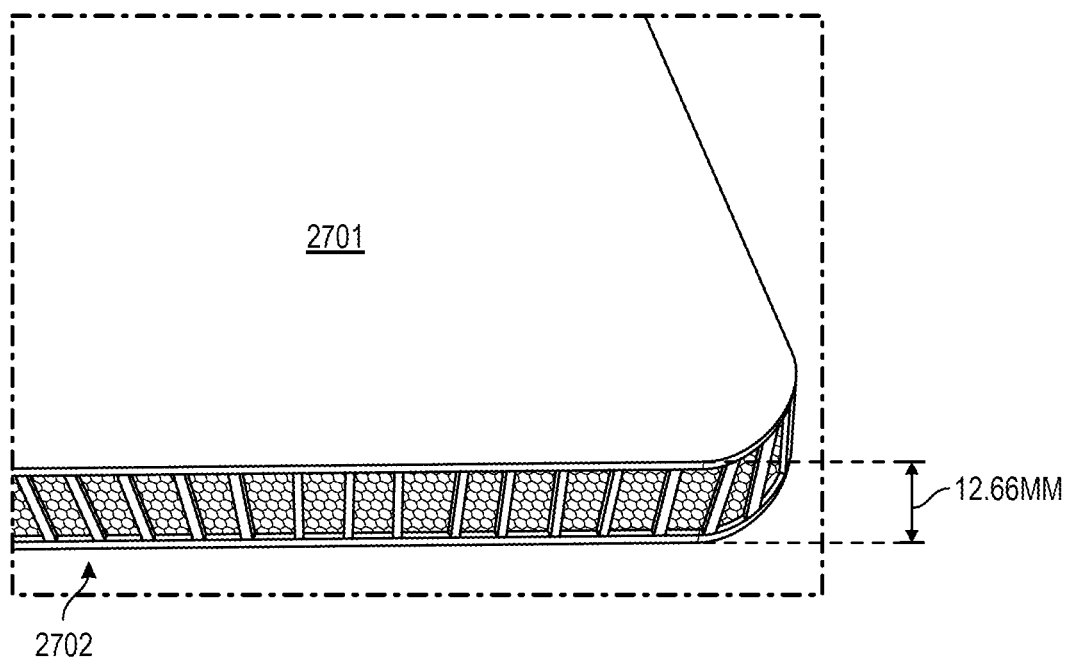
FIG. 27(a) illustrates photograph of the honeycomb composite panel.

The capability of proposed UHF array for near-field imaging of practical low-loss composite structures was assessed extensively. For instance, the developed array was used to detect water permeation inside aerospace radome composite panel. Radomes are used to protect critical airborne systems, and their structural integrity could be compromised due to water permeation. Hence, it is imperative to detect such anomaly during routine inspections. The radome specimen considered herein consists of paper honeycomb core sandwiched between two thin fiberglass skin laminates with thickness of 0.5 mm and 1.27 mm for the top and bottom skins, respectively. The total thickness of the panel is 12.6 mm as annotated in the sample photograph provided in FIG. 27(a). Reference number 2701 denotes top skin laminate. Reference number 2702 denotes honeycomb core. Water permeation was emulated by injecting 0.1 cc of water into one cell from the bottom side of the sample. After that, the panel was scanned from the top side using the proposed UHF array, a 24 GHz rectangular aperture probe, and a 24 GHz circular aperture probe. All images were obtained for a scan area of 80 mm×50 mm with 1 mm step size in both directions and a standoff distance of 1 mm.

Figure 27B:
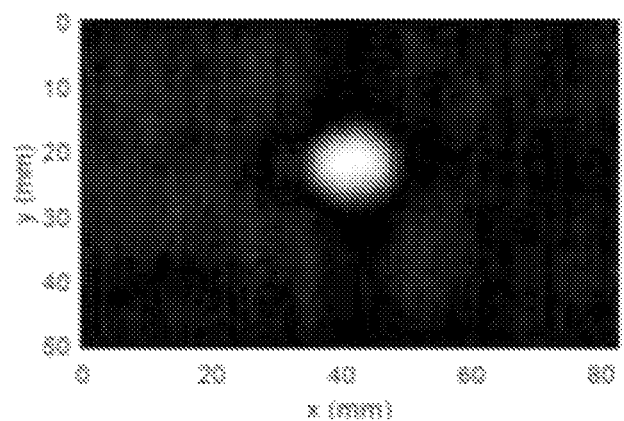
FIG. 27(b) illustrates near-field image produced using the inventive UHF array.
Figure 27C:
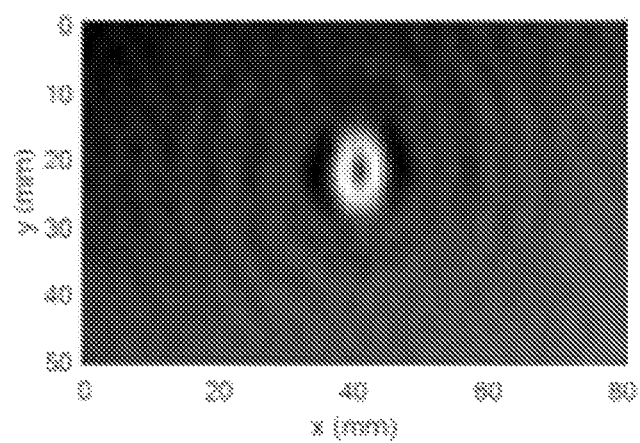
FIG. 27(c) illustrates near-field image produced using 24 GHz circular waveguide.
Figure 27D:
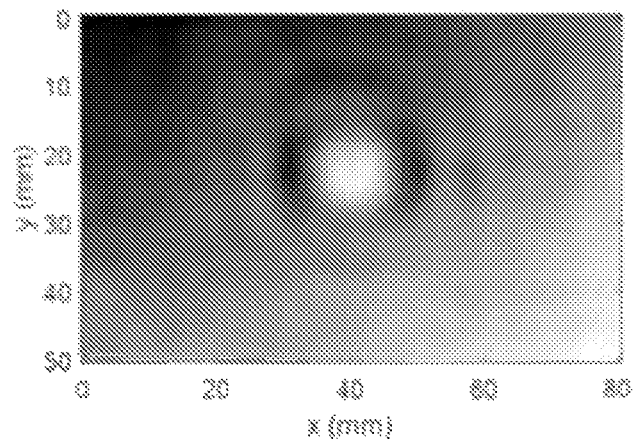
FIG. 27(d) illustrates near-field image produced using 24 GHz rectangular aperture probe.

FIG. 27(b)-(d) show the images obtained using the proposed array, circular aperture, and rectangular aperture probes, respectively. It is evident that the proposed array probe yielded a high-fidelity image of the water permeation. The proposed array probe provided a relatively more uniform image background compared to the other probes. Also, its image does not show the artifacts produced due to the near-field side-lobe interactions typically produced using the utilized aperture probes. For quantitative comparison, the signal-to-noise ratio (SNR) was computed for the result images in FIG. 27. The SNR was computed by taking the ratio of standard deviation (noise) of the signal from the non-defected area and the mean of the voltages over the defected area. The image SNR calculated for the images are around 408, 261, and 310 for the UHF array, circular aperture, and the rectangular aperture, respectively.

The time required to produce the images using the UHF array is less than half the time required to produce images of the same area using a single scanned probe. This improvement is significant time saving as practical screening tools are required to provide rapid inspection of large areas.

Near-field microwave imaging have shown great potential for wide range of applications. Planar open resonator probes have been successfully used for high-resolution near-field imaging. For rapid near-field imaging, a one-dimensional array of planar open resonator probes was demonstrated for the first time in the present invention. For the array to operate as desired, the mutual coupling was electronically controlled through active loading of the elements with PIN-diode based detuning circuit. The array response and its capability to rapidly produce 2D images of multiple practical samples were demonstrated in the present invention.

While the present disclosure has been shown and described with reference to various embodiments thereof, it will be understood by those skilled in the art that various changes in form and details may be made therein without departing from the spirit and scope of the present disclosure as defined by the appended claims and their equivalents. The present disclosure may be implemented to be different forms, and may not be limited to embodiments described above For instance: the different shapes and dimensions, different array configuration (1D, 2D, and 3D); different modulation schemes; using other active elements such as Varactor diodes; different matching circuits; topoglies; different image formation (e.g., map of frequency shifts);

different material and construction (e.g., using flexible PCBs). While this particular embodiment according to the present invention was demonstrating on qualitative imaging application, the disclosed imaging probe and array can be used for quantitative material characterization. All such changes, modifications, variations and other uses and applications, which do not depart from the spirit and scope of the invention, are deemed to be covered by the invention, which is to be limited only by the claims which follow.

The invention claimed is:

1. A high-resolution Ultra High Frequency (UHF) microwave resonant near-field imaging sensor comprising:
   a spiral resonator (SR) comprising a conductor;
   a non-resonant electrically small loop antenna at least partially surrounding the SR on a plane, the non-resonant electrically small loop antenna generating a magnetic field perpendicular to the plane inducing a current in the conductor of the SR;
   an L-matching circuit electrically coupled with the non-resonant electrically small loop antenna, the L-matching circuit comprising a measurement port configured to input a microwave signal into the imaging sensor and receive a reflected signal from the imaging sensor; and
   a resonant detuning circuit electrically coupled with the non-resonant electrically small loop antenna and comprising a diode configured to move between on and off states.

2. The imaging sensor as claimed in claim 1, wherein the imaging sensor acts as a single port probe for near-field imaging in a UHF band, the UHF band being in the range of 300 MHz to 3 GHz, and wherein capacitors are used to match the single port probe to a feeding 50-Ω line.

3. The imaging sensor as claimed in claim 1, wherein the SR has a side length in the range of 5 millimeters (mm)-10 mm.

4. The imaging sensor as claimed in claim 3, wherein the side length of the SR is 7.2 mm.

5. The imaging sensor as claimed in claim 1, wherein the small loop antenna and the SR are made of copper strips laid on a thick Rogers 4350 substrate, and wherein the copper strips have a dimension in the range of 0.10-0.15 mm.

6. The imaging sensor as claimed in claim 5, wherein the copper strips have a dimension of 0.127 mm.

7. The imaging sensor as claimed in claim 1, wherein the imaging sensor detects defects in multilayer dielectric samples, corrosion samples and in composite structures irrespective of their orientation relative to the imaging sensor.

8. The imaging sensor as claimed in claim 1, wherein the imaging sensor relies on one-port measurement and wherein images are formed based on reflection coefficient measured at an input of the non-resonant electrically small loop antenna.

9. The imaging sensor as claimed in claim 1, wherein the imaging sensor has an operating wavelength and detects various surface anomalies and subsurface flaws with dimensions much smaller than the operating wavelength.

10. An imaging probe unit, comprising an imaging sensor according to claim 1, wherein the imaging sensor is loaded with a PIN diode, an L-matching circuit used to match the imaging sensor, and an LC resonant detuning circuit, which controls probe response together with the PIN diode.

11. A one-dimensional array, comprising a plurality of imaging probe units according to claim 10, wherein the imaging probe units are placed side by side in very close proximity of each other.

12. The one-dimensional array as claimed in claim 11, wherein the imaging probe units are placed side by side with an interspacing distance of 9.14 mm.

13. The one-dimensional array as claimed in claim 11, wherein the one-dimensional array comprises eight identical imaging probe units arranged on an x-axis with uniform interspacing of 9.14 mm, wherein a total array length is around 73 mm.

14. The one-dimensional array as claimed in claim 11, wherein each LC resonant detuning circuit in the one-dimensional array can be controlled independently.

15. An imaging system, comprising a one-dimensional array as claimed in claim 11, a vector network analyzer (VNA), a switch, which is connected to the one-dimensional array and the VNA, and a control unit which is configured to control the switch and the one-dimensional array.

16. A high-resolution Ultra High Frequency (UHF) microwave resonant near-field imaging sensor comprising:
   a spiral resonator comprising a conductor and configured to focus an Ultra High Frequency (UHF); and
   a non-resonant electrically small loop antenna surrounding the SR on a plane such that the SR is positioned at the center of the non-resonant electrically small loop antenna;
   an L-matching circuit electrically coupled with the non-resonant electrically small loop antenna, the L-matching circuit configured to match the imaging sensor to 50 Ohms at a frequency of operation and comprising a measurement port configured to input a microwave signal into the imaging sensor and receive a reflected signal from the imaging sensor;
   wherein the non-resonant electrically small loop antenna has a length less than an operating wavelength, and
   wherein the non-resonant electrically small loop antenna feeds the SR and generates a magnetic field perpendicular to the plane inducing a current in the conductor of the SR.

17. The imaging sensor as claimed in claim 1, wherein the L-matching circuit is configured to match the imaging sensor to 50 Ohms at the measurement port.

18. The imaging sensor as claimed in claim 1, wherein the diode changes to the on state in response to a positive voltage and changes to the off state in response to a negative voltage.

19. The imaging sensor as claimed in claim 18, wherein the positive voltage and the negative voltage are supplied through a filtering circuit comprising two ferrite beads and a high decoupling capacitor.

20. The imaging sensor as claimed in claim 1, wherein when the diode is in the on state the imaging sensor is in an on state and when the diode is in the off state the imaging sensor is in an off state.

* * * * *